United States Patent
Kobayashi

(10) Patent No.: US 7,252,923 B2
(45) Date of Patent: Aug. 7, 2007

(54) METHODS FOR PRODUCING PATTERN-FORMING BODY

(75) Inventor: Hironori Kobayashi, Tokyo-to (JP)

(73) Assignee: Dai Nippon Printing Co., Ltd., Tokyo-to (JP)

(*) Notice: Subject to any disclaimer, the term of this patent is extended or adjusted under 35 U.S.C. 154(b) by 299 days.

(21) Appl. No.: 10/272,096

(22) Filed: Oct. 16, 2002

(65) Prior Publication Data

US 2003/0087073 A1 May 8, 2003

(30) Foreign Application Priority Data

Oct. 16, 2001 (JP) .............................. 2001-318742
Jun. 24, 2002 (JP) .............................. 2002-182470

(51) Int. Cl.
*G03F 7/00* (2006.01)
*G03F 7/038* (2006.01)
*G03F 7/039* (2006.01)
*G03F 7/20* (2006.01)

(52) U.S. Cl. .................. 430/270.1; 430/302; 430/306; 430/325; 430/326; 430/5; 430/9

(58) Field of Classification Search .................. 430/5, 430/7, 272.1, 273.1, 302, 303, 321; 347/106
See application file for complete search history.

(56) References Cited

U.S. PATENT DOCUMENTS 4,081,282 A * 3/1978 Merrill et al. ........... 430/273.1

6,450,635 B1 * 9/2002 Okabe et al. ............... 347/106
6,846,616 B2 * 1/2005 Kobayashi et al. ......... 430/311
2003/0059686 A1 * 3/2003 Kobayashi et al. ............ 430/5

OTHER PUBLICATIONS

Abraham Ulman, "Formation and Structure of Self-Assembled Monolayers", Chemical Review, 96, pp. 1533-1554 (1996).
Tokuji Miyashita et al., "LB-Film—Toward Nano-technology for Fabrication of Soft Nano-devices", Kobunshi, vol. 50, Sep. issue, pp. 644-647 (2001).
Paula T. Hammond, "Recent Explorations in electrostatic multilayer thin film assembly", Current Opinion in Colloid & Interface Science, 4, pp. 430-442 (2000).

* cited by examiner

*Primary Examiner*—Sin Lee
(74) *Attorney, Agent, or Firm*—Ladas & Parry LLP

(57) ABSTRACT

A method of producing a pattern-forming body with high accuracy with no need for a post-exposure treatment and without allowing any photocatalyst to remain in the resultant pattern-forming body and whereby any problematic effect of the photocatalyst in the pattern-forming body is eliminated. The method includes providing a photocatalyst-containing layer-sided substrate and a pattern-forming body substrate having a characteristic-changeable layer, which is changed by the effect of the photocatalyst in the photocatalyst-containing layer, and a light-shading part formed as a pattern in such a manner that the photocatalyst-containing layer and the characteristic-changeable layer are brought into contact with each other, followed by exposure on the side of the pattern-forming body substrate to change the characteristics of the characteristic-changeable layer of the exposed part, followed by removing the photocatalyst-containing layer-sided substrate.

39 Claims, 7 Drawing Sheets

METHODS FOR PRODUCING PATTERN-FORMING BODY

BACKGROUND OF THE INVENTION

The present invention relates to a method for producing a pattern-forming body comprising a pattern having different characteristics on the surface that can be used in various applications such as a color filter.

Various methods for producing pattern-forming bodies having various patterns such as graphics, images, texts and circuits on substrates have been proposed.

For example, when discussing a case of printing as an example, a planographic plate employed in a planographic printing which is one of the printing methods is employed in such a manner that a plate having a pattern comprising an ink-receiving lipophilic part and a printing ink-repelling part is produced and used to form an image of the ink to be printed on the lipophilic part and the image thus formed is then transferred for example onto a paper whereby accomplishing the printing. In such a printing, a pattern such as a text or figure is formed on such a master printing plate to produce a printing plate as a pattern-forming body which is then fitted in the printing machine and used. Many types of the master plates for an offset press which is a representative planographic process have been proposed.

An offset printing plate can be produced by a method in which a master plate is exposed via a mask on which a pattern was depicted and then developed or by a method in which an electrophotographic process is employed to effect a direct exposure whereby making a plate directly on the master plate. An electrophotographic offset master plate is produced by a method in which a photoconductive layer having a photoconductive particle such as zinc oxide and a binder resin as main components are formed on a conductive substrate to form a photosensitive body with which the exposure is effected by an electrophotographic process to form a highly lipophilic image on the surface of the photosensitive body, which is then treated with a fat-insensitizing solution to make a non-image part hydrophilic whereby obtaining an offset master plate, i.e., a pattern-forming body. The hydrophilic part is immersed for example in water to be imparted with a lipophobicity, while a lipophilic image part receives a printing ink which is then transferred for example to a paper. However, various post-exposure treatments for example with fat-insensitizing solutions are required for forming a pattern.

A method for producing a planographic master plate employing a heat mode recording material capable of forming a pattern comprising a highly ink-receiving part and an ink-repelling part by means of a laser irradiation has also been proposed. While the heat mode recording material is advantageous due to the ability of producing a printing plate only by forming an image simply by a laser beam without processes for example of development, it poses problems associated with adjustment of the laser intensity, disposal of the residues such as a laser-degenerated solid substance, printing resistance and the like.

Another known method for forming a highly minute pattern is a method for producing a pattern-forming body by photolithography which forms an intended pattern directly by the exposure of a photoresist, involving a process for exposing a photoresist coated on a substrate with a pattern followed by developing the photoresist followed for example by etching or using a functional substance as a photoresist.

While a highly minute pattern formation by the photolithography is employed for example in a method for forming a colored pattern of a color filter employed in a liquid crystal display, forming a microlens, producing a minute electric circuit board, and producing a chrome mask employed in exposing a pattern, such a method poses a problem for example of the waste liquid disposal due to the requirement of the post-exposure developing with a liquid developer or etching associated with the use of a photoresist, as well as a problematic degradation of a functional substance, if employed as a photoresist, due to alkaline solution employed for developing.

Although an attempt is made to form a highly minute pattern of a color filter and the like by printing, a pattern formed by the printing is problematic with regard to the position accuracy and the like, resulting in a difficulty in forming a pattern at a high accuracy.

On the other hand, a method for producing a pattern-forming body in which a pattern is formed using a substance whose wettability is changed by the effect of a photocatalyst has been investigated by us for the purpose of solving the problems described above. Nevertheless, the conventional method for producing a pattern-forming body using a photocatalyst can not avoid the aspect that the resultant pattern-forming body itself contains the photocatalyst which may affect some types of the pattern-forming body adversely.

When forming a pattern using a substance whose wettability is changed by the effect of a catalyst as described above, the exposure should be conducted in a pattern usually employing a photomask. However, the exposure via a photomask needs to position the photomask precisely, resulting in a problem associated with the accuracy of the positioning especially when forming a highly minute pattern. The use of a photomask may also require a distance to be provided between the surface of the pattern irradiation target layer whose wettability is changed and the photomask or may involve other intermediate layers. In such a case, a disadvantage may be experienced in forming a highly minute pattern due to the scattering of the light irradiated.

SUMMARY OF THE INVENTION

Accordingly, a method is desired by which a pattern-forming body can be produced at a high accuracy with no need of the post-exposure treatment without allowing any photocatalyst to remain in the resultant pattern-forming body whereby eliminating any problematic effect of the photocatalyst in the pattern-forming body itself.

The present invention provides a method for producing a pattern-forming body comprising, placing a photocatalyst-containing layer-sided substrate having a photocatalyst-containing layer containing a photocatalyst and a substrate and a pattern-forming body substrate having a characteristic-changeable layer whose characteristics are changed by the effect of the photocatalyst in the photocatalyst-containing layer and a light-shading part formed as a pattern in such a manner that the photocatalyst-containing layer and the characteristic-changeable layer are brought into contact with each other, followed by exposure on the side of the pattern-forming body substrate to change the characteristics of the characteristic-changeable layer of the exposed part, followed by removing the photocatalyst-containing layer-sided substrate whereby obtaining a pattern-forming body having a pattern whose characteristics have been changed on the characteristic-changeable layer.

In the present invention, since an inventive method forms a pattern by changing the characteristics of a characteristic-changeable layer of an exposed part by effecting the exposure after positioning a photocatalyst-containing layer in contact with the characteristic-changeable layer, as described above, it can produce a pattern-forming body having a highly minute pattern whose characteristics have been changed without any requirement of the post-exposure treatments. It also eliminates the problematic sustained effect of the photocatalyst in the pattern-forming body since no photocatalyst is contained in the pattern-forming body itself because of the removal of the photocatalyst-containing layer-sided substrate from the pattern-forming body after the exposure. Furthermore, a pattern-forming body substrate, which is provided with a light-shading part which has previously been formed as a pattern, eliminates the requirement of using a photomask when conducting a pattern exposure on the characteristic-changeable layer, whereby enabling the pattern exposure on the characteristic-changeable layer simply by overall exposure on the side of the pattern-forming body substrate. Accordingly, there is no need of a photomask to be provided separately, or of positioning with the photomask. As a result, a pattern-forming body can be formed by a convenient process.

The present invention also provides a method for producing a pattern-forming body comprising, placing a photocatalyst-containing layer-sided substrate having a photocatalyst-containing layer containing a photocatalyst and a substrate and a pattern-forming body substrate having a characteristic-changeable layer whose characteristics are changed by the effect of the photocatalyst in the photocatalyst-containing layer and a light-shading part formed as a pattern in such a manner that the distance between the photocatalyst-containing layer and the characteristic-changeable layer is 200 µm or less, followed by exposure on the side of the pattern-forming body substrate to change the characteristics of the characteristic-changeable layer of the exposed part, followed by removing the photocatalyst-containing layer-sided substrate whereby obtaining a pattern-forming body having a pattern whose characteristics have been changed on the characteristic-changeable layer.

According to the present invention, by placing the photocatalyst-containing layer and the characteristic-changeable layer at a certain distance and then exposing, the characteristics of the characteristic-changeable layer of an exposed part can efficiently been changed to form a pattern, whereby obtaining a pattern-forming body having a highly minute pattern whose characteristics have been changed with no need of any particular post-exposure treatment.

In the present invention, it is preferred that the pattern-forming body substrate comprises a transparent substrate, a characteristic-changeable layer formed on the transparent substrate, and a light-shading part formed as a pattern. While the invention may not need a transparent substrate since the characteristic-changeable layer itself has a self supporting property, a material whose sensitivity to the change in the characteristics is satisfactory is poorly self-supportive in general, and should frequently be formed as a coating film on a substrate. Accordingly, it is preferable to employ the characteristic-changeable layer formed on a transparent substrate as described above.

In the present invention, it is preferred that the light-shading part has been formed as a pattern on the transparent substrate, and is covered with the characteristic-changeable layer formed thereon. While the place of the light-shading part is not limited particularly, the light-shading part as a pattern is formed preferably in a place closer as possible to the place where the photocatalyst-containing layer is brought into contact with the characteristic-changeable layer in order to improve the accuracy with avoiding the diffused reflection. Accordingly, it is preferred that the light-shading part as a pattern is formed in the place specified above.

In the present invention, it is preferred that the photocatalyst-containing layer is a layer consisting of a photocatalyst. When the photocatalyst-containing layer is a layer consisting only of a photocatalyst, it is possible to improve the efficiency of changing the characteristics of the characteristic-changeable layer, whereby enabling an efficient production of a pattern-forming body.

In the present invention, it is preferred that the photocatalyst-containing layer is a layer obtained by forming a film of a photocatalyst on a substrate by means of a vacuum film-forming method. When forming the photocatalyst-containing layer by the vacuum film-forming method as described above, it is possible to form a photocatalyst-containing layer whose surface is less irregular and which has a uniform film thickness, whereby enabling a uniform and highly efficient formation of a pattern whose characteristics in the characteristic-changeable layer have been changed.

On the other hand, in the present invention, it is preferred, that the photocatalyst-containing layer may be a layer having a photocatalyst and a binder. By using such a binder, it is possible to form the photocatalyst-containing layer in a relatively easier manner, resulting in a less expensive formation of a pattern-forming body.

In the present invention, it is preferred that the photocatalyst is one or more substances selected from the group containing titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$), and, among these, titanium oxide ($TiO_2$) is employed preferably as a photocatalyst since it is effective as a photocatalyst due to a high band gap energy of titanium oxide and it is stable chemical, non-toxic and readily available.

In the present invention, it is preferred that the exposure is effected with heating the photocatalyst-containing layer. By conducting the exposure described above with heating the photocatalyst-containing layer, it is possible to enhance the effect of the photocatalyst, whereby allowing the exposure to be completed efficiently within a short period.

In the present invention, it is preferred that the distance between the photocatalyst-containing layer and the characteristic-changeable layer is within the range from 0.2 µm to 10 µm when the photocatalyst-containing layer is placed on the surface of the characteristic-changeable layer to effect the exposure. By effecting the exposure with providing a certain short distance as described above, it is possible to change the characteristics of the characteristic-changeable layer more effectively.

In the present invention, it is preferred that the characteristic-changeable layer is a layer containing no photocatalyst. By employing as the characteristic-changeable layer a layer containing no photocatalyst, it is possible to avoid a sustained effect of the photocatalyst regardless of the pattern of the pattern-forming body.

In the present invention, it is preferred that the characteristic-changeable layer is a wettability-changeable layer whose wettability is changed in such a manner that the contact angle with a liquid upon exposure is reduced by the effect of the photocatalyst contained in the photocatalyst-containing layer. By employing as the characteristic-changeable layer a wettability-changeable layer undergoing a reduction in the contact angle with a liquid upon exposure as a result of the effect of the photocatalyst, it is possible to utilize the difference in the wettability between the non-exposed part ant the exposed part to facilitate the deposition for example of an ink to the exposed pattern, whereby facilitating the formation of a functional element.

In the present invention, it is preferred that the contact angle with a liquid whose surface tension is 40 mN/m on the wettability-changeable layer is 10° or more in a non-exposed part and 9° or less in an exposed part. A contact angle of a non-exposed part of the wettability-changeable layer described above with a liquid less than 10° leads to an insufficient lyophobic performance, while a contact angle of an exposed part with a liquid of 10° or more leads to a poor spreading of a functional element composition for the functional part such as an ink, resulting in a disadvantageous event such as a color blank in the case for example that the functional element is a pixel part of a color filter.

In the present invention, it is preferred that the wettability-changeable layer is a layer containing an organopolysiloxane. In the invention, a wettability-changeable layer should be characterized by the tendency that it exhibits a lyophobic behavior when being not exposed but becomes lyophilic when being exposed as a result of the effect of a photocatalyst contained in a photocatalyst-containing layer with which it is in contact. As a material which imparts the wettability-changeable layer with such a tendency, an organopolysiloxane is employed preferably.

In the present invention, it is preferred that the organopolysiloxane is a polysiloxane containing a fluoroalkyl group. By containing such a fluoroalkyl group, it is possible to increase the difference in the wettability between an exposed part and a non-exposed part.

In the present invention, it is preferred that the organopolysiloxane is an organopolysiloxane which is a hydrolytic condensate or a hydrolytic co-condensate of one or more silicon compounds represented by Formula: $Y_nSiZ_{(4-n)}$, where Y denotes analkyl group, fluoroalkyl group, vinyl group, amino group, phenyl group, or epoxy group, X denotes an alkoxyl group or halogen, and n denotes an integer of 0 to 3. By using such an organopolysiloxane, the characteristics in response to the change in the wettability described above can be exerted.

In the present invention, it is possible that the pattern-forming body substrate has a self supporting wettability-changeable layer on whose surface a light-shading part formed as a pattern is provided. A wettability-changeable layer which has a self supporting property eliminates the necessity of employing a substrate and the like, and allows a pattern-forming body to be formed readily for example by using a commercially available resin film on whose one side a light-shading part has been formed.

In the present invention, it is preferred that the characteristic-changeable layer is a decomposition-removable layer which is decomposed and removed upon exposure by the effect of the photocatalyst in the photocatalyst-containing layer. By employing as a characteristic-changeable layer a decomposition-removable layer which is decomposed and removed upon exposure by the effect of the photocatalyst, it is possible to form an irregular pattern.

In the present invention, it is preferred that the contact angle of a liquid with the decomposition-removable layer is different from the contact angle of a liquid with the transparent substrate which comes out when the decomposition-removable layer is decomposed and removed. As a result of the difference in the contact angle with a liquid between the decomposition-removable layer and the transparent substrate which comes out after the decomposition and removal, a pattern can be formed utilizing this difference in the wettability.

In the present invention, it is preferred that the decomposition-removable layer is either one of a self-assembled monolayer, Langmuir-Blodgett film or layer-by-layer self-assembled film. By employing such a film as a decomposition-removable layer, a film having a relatively high strength without any defect can readily be formed.

In the present invention, it is preferred that the wettability on the transparent substrate is 9° or less as a contact angle with a liquid whose surface tension being 40 mN/m and that on the decomposition-removable layer being 10° or more. By adjusting the wettability of a transparent substrate and of a decomposition-removable layer within the respective ranges specified above, it is possible to impart the part on which the transparent substrate comes out when the decomposition-removable layer is decomposed and removed and the part on which the decomposition-removable layer is remaining with a lyophobic property, whereby facilitating the formation for example of a functional element.

The present invention also provides a pattern-forming body comprising, a transparent substrate, a characteristic-changeable layer formed on the transparent substrate whose characteristics are changed by the effect of a photocatalyst and a light-shading part formed as a pattern, and also comprising, a pattern whose characteristics on the characteristic-changeable layer have been changed. Since an inventive pattern-forming body has a light-shading part, it eliminates the necessity of a photomask when being exposed as a pattern in contact with a photocatalyst-containing layer, whereby eliminating the process for positioning the photomask, resulting in a cost efficient pattern-forming body.

In the present invention, it is preferred that light-shading part has been formed as a pattern on the transparent substrate, and is covered with the characteristic-changeable layer formed thereon. Since it is possible to form a light-shading part as a pattern in a place closer as possible to the place where the photocatalyst-containing layer is brought into contact with the characteristic-changeable layer as described above, it is possible to prevent a reduction in the pattern accuracy due for example to the energy scattering, whereby enabling the formation of a highly minute pattern-forming body.

In the present invention it is preferred that the characteristic-changeable layer is a wettability-changeable layer whose wettability is changed by the effect of the photocatalyst. By employing as a characteristic-changeable layer such a wettability-changeable layer, it is possible utilize the difference in the wettability to obtain a pattern-forming body capable of forming a functional element efficiently.

In the present invention, it is preferred that the contact angle with a liquid whose surface tension is 40 mN/m on the wettability-changeable layer is 10° or more in a non-exposed part and 9° or less in an exposed part. Since a non-exposed part is required to have a lyophobic ability and an exposed part is required to be lyophilic as described above, the wettability at a degree specified above is required.

In the present invention, it is preferred that the wettability-changeable layer is a layer containing an organopolysiloxane, and this organopolysiloxane is preferably a polysiloxane containing a fluoroalkyl group. Such a wettability-changeable layer gives a substantial change in the wettability as a result of the exposure when being in contact with a photocatalyst-containing layer.

In the present invention, it is preferred that the organopolysiloxane is an organopolysiloxane which is a hydrolytic condensate or a hydrolytic co-condensate of one or more silicon compounds represented by Formula: $Y_nSiZ_{(4-n)}$, where Y denotes an alkyl group, fluoroalkyl group, vinyl group, amino group, phenyl group, or epoxy group, X denotes an alkoxyl group or halogen, and n denotes an integer of 0 to 3. By forming a wettability-changeable layer using such an organopolysiloxane as a starting material, it is possible to obtain a pattern-forming body on which a wettable pattern having a substantial difference in the wettability has been formed.

The present invention also provides a pattern-forming body comprising, a self supporting wettability-changeable layer and a light-shading part formed as a pattern on one side of the wettability-changeable layer and also comprising, a pattern comprising a lyophilic region and a lyophobic region on the other side of the wettability-changeable layer. Since such a pattern-forming body allows a pattern having a different wettability to be obtained only by forming a light-shading part as a pattern on the surface of one side for example of a commercially available film followed by exposing while the surface of the other side being in contact with a photocatalyst-containing layer, resulting in a cost efficient pattern-forming body.

In the present invention, it is preferred that the wettability-changeable layer is a layer containing no photocatalyst, since it is possible to obtain a pattern-forming body avoiding a sustained effect of the photocatalyst.

In the present invention, it is preferred that the characteristic-changeable layer is a decomposition-removable layer which is decomposed and removed by the effect of the photocatalyst. By employing as a characteristic-changeable layer a decomposition-removable layer, it is possible to form an irregular pattern.

In the present invention, it is preferred that the light-shading part has been formed as a pattern on the transparent substrate, and is covered with the decomposition-removable layer. Since it is possible to form a light-shading part as a pattern in a place closer as possible to the place where the photocatalyst-containing layer is brought into contact with the wettability-changeable layer as described above, it is possible to prevent a reduction in the pattern accuracy due for example to the energy scattering, whereby enabling the formation of a highly minute pattern-forming body.

In the present invention, it is preferred that the contact angle of a liquid with the decomposition-removable layer is different from the contact angle of a liquid with the transparent substrate which comes out when the decomposition-removable layer is decomposed and removed. As a result of the difference in the contact angle with a liquid between the decomposition-removable layer and the transparent substrate which comes out after the decomposition and removal of the decomposition-removable layer, it is possible to obtain, utilizing this difference in the wettability, a pattern-forming body with which a functional element can readily be formed.

In the present invention, it is preferred that the decomposition-removable layer is either one of a self-assembled monolayer, Langmuir-Blodgett film, or layer-by-layer self-assembled film. As described above, by employing such a film as a decomposition-removable layer, a film having a relatively high strength without any defect can readily be formed.

In the invention, it is preferred that the wettability on the transparent substrate is 9° or less as a contact angle with a liquid whose surface tension being 40 mN/m and that on the decomposition-removable layer being 10° or more. As described above, by adjusting the wettability of a transparent substrate and of a decomposition-removable layer within the respective ranges specified above, it is possible to impart the part on which the transparent substrate comes out which the decomposition-removable layer and the part on which the decomposition-removable layer is remaining with a lyophobic property, whereby facilitating the formation for example of a functional element.

The present invention also provides a functional element comprising, a functional part positioned along the pattern formed by the change in the characteristics in a characteristic-changeable layer on a transparent substrate. By using an inventive pattern-forming body as described above, a functional element can readily be obtained.

In the present invention, a functional element, where the functional part is a metal as described above, is provided. This enables an application for example to a highly minute electric circuit substrate.

In the present invention, a color filter comprising, a pixel part as a functional part of a functional element is provided. Such a color filter is of an extremely high quality because of its highly minute pixel part formed therein at a high accuracy. Similarly, the invention also provides a microlens comprising, a lens part as a functional part of a functional element. Since this also allows a highly accurate microlens to be obtained by a simple process, it is a less expensive microlens of a high quality.

DESCRIPTION OF THE PREFERRED EMBODIMENTS

Figure 1A:
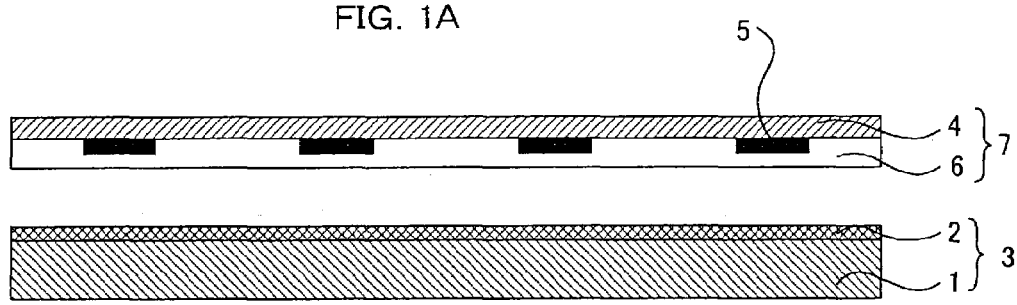
FIG. 1 is a process diagram indicating an example of the method for producing a pattern-forming body of the present invention.

The invention relates to a method for producing a pattern-forming body and also to a pattern-forming body itself. The invention is detailed below in sections.

A. Methods for Producing Pattern-forming Bodies

A method for producing a pattern-forming body of the present invention is detailed below. In a method for producing a pattern-forming body of the invention, a photocatalyst-containing layer-sided substrate having a photocatalyst-containing layer containing a photocatalyst and a substrate and a pattern-forming body substrate having a characteristic-changeable layer whose characteristics are changed by the effect of the photocatalyst in the photocatalyst-containing layer and a light-shading part formed as a pattern are exposed on the side of the pattern-forming body substrate with the photocatalyst-containing layer and the characteristic-changeable layer being brought into contact with each other to change the characteristics of the characteristic-changeable layer of the exposed part and then the photocatalyst-containing layer-sided substrate is removed to obtain a pattern-forming body having a pattern whose characteristics have been changed on the characteristic-changeable layer.

As described above, in a method for producing a pattern-forming body of the present invention, an overall exposure from the side of the characteristic-changeable layer with the photocatalyst-containing layer being in contact with the characteristic-changeable layer results in the change in the characteristics of a characteristic-changeable layer of a part exposed by the effect of a photocatalyst in a photocatalyst-containing layer, whereby yielding a pattern formed by the part which has been exposed on the characteristic-changeable layer, i.e., the part whose characteristics have been changed. Accordingly, the pattern formation does not need any post-treatments such as post-exposure developing or washing, allowing a pattern having different characteristics to be obtained by reduced number of manufacturing process at a lower cost when compared with conventional methods. Therefore, it is possible to form a functional element such as a color filter more readily at a lower cost by forming the functional part a long the resultant pattern whose characteristics have been changed.

Also since in the present invention the photocatalyst-containing layer-sided substrate is removed to obtain the pattern-forming body substrate as a pattern-forming body after changing the characteristics on the characteristic-changeable layer by the effect of the photocatalyst in the photocatalyst-containing layer, the resultant pattern-forming body does not necessarily contain the photocatalyst. Accordingly, when the resultant pattern-forming body is imparted with a functional part to form a functional element, the functional element can avoid any disadvantageous sustained effect of the photocatalyst.

Also since in the present invention the light-shading part is formed as a pattern on the substrate on the pattern-forming body substrate, an overall exposure on the side of the pattern-forming body substrate allows a pattern having different characteristics to be formed readily on the characteristic-changeable layer. Accordingly, the inventive method does not require a photomask, which is required in an ordinary pattern exposure, or photo-writing and the like. In addition, the possibility of allowing the position where the light-shading part to be close to the position where the photocatalyst-containing layer is in contact with the characteristic-changeable layer leads to the prevention of any reduction in the accuracy due to the scattering of the energy for example of the exposing light, whereby yielding a pattern having an extremely high accuracy.

A method for producing a pattern-forming body of the present invention is now discussed with referring to figures. The term "pattern" employed in the present invention is not limited particularly, and may be any of various pattern including graphics, images, circuits, and texts.

FIG. 1 shows an example of the methods for producing pattern-forming bodies according to the present invention. In this production method, a photocatalyst-containing layer-sided substrate 3 comprising a substrate 1 and a photocatalyst-containing layer 2 formed on the substrata 1 and a pattern-forming body substrate 7 comprising a transparent substrate 4, a light-shading part 5 formed as a pattern on this transparent substrate 4, and a characteristic-changeable layer 6 formed on this light-shading part 5 are provided (FIG. 1A).

Figure 1B:
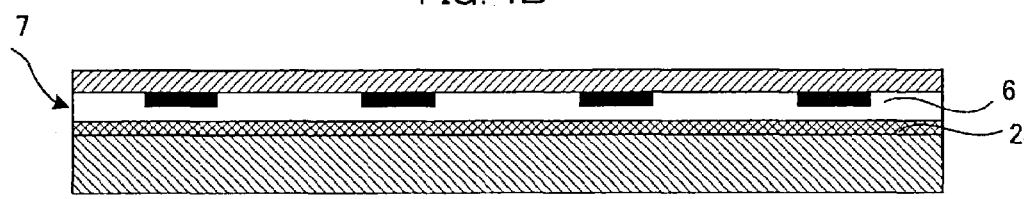

Then, the photocatalyst-containing layer 2 in the photocatalyst-containing layer-sided substrate 3 is placed in contact with the characteristic-changeable layer 6 in the pattern-forming body substrate 7 (FIG. 1B). This contact is not limited to a completely close contact, and a placement involving a certain distance may be acceptable as described below.

Figure 1C:
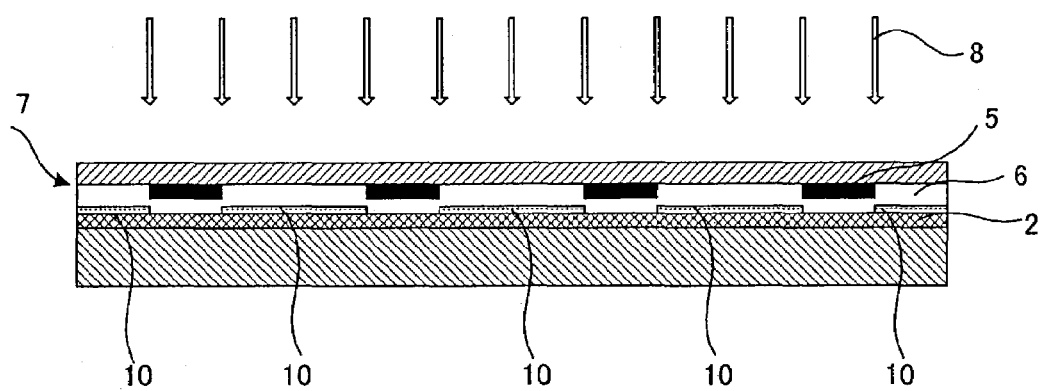

Under the condition where the photocatalyst-containing layer 2 and the characteristic-changeable layer 6 are placed as described above, energy 8 is irradiated on the side of the pattern-forming body substrate 7. As a result, the characteristics of the characteristic-changeable layer 6 of a part where the light-shading part 5 has not been formed are changed to yield a characteristic-changeable region 10 (FIG. 1C).

Subsequently, the photocatalyst-containing layer-sided substrate 3 is removed (separated) to obtain a pattern-forming body 7' on which the characteristic-changeable region 10 has been formed.

Employing the production method described above as an example, a method for producing a pattern-forming body of the present invention is further detailed below.

1. Photocatalyst-containing Layer-sided Substrate

A photocatalyst-containing layer-sided substrate employed in the present invention is discussed first. A photocatalyst-containing layer-sided substrate employed in a method for producing a pattern-forming body of the invention has at least a photocatalyst-containing layer and a substrate, and is formed usually by forming a photocatalyst-containing layer as a thin film on a substrate by a certain method. The component-by-component description is made below.

(Photocatalyst-containing Layer)

A photocatalyst-containing layer employed in the invention is not limited particularly provided that it allows a photocatalyst contained in the photocatalyst-containing layer to change the characteristics of a characteristic-changeable layer with which it is brought into contact, and may comprising a photocatalyst and a binder or may be a layer formed as a film only from a photocatalyst itself. The wettability of its surface may be of lyophilic or it may have a lyophobic surface.

While the action mechanism of a photocatalyst in a photocatalyst-containing layer, such as titanium oxide described above, is not known clearly, it is assumed that a carrier generated by the irradiation of a light may reacts directly with a nearby compound or may yield active oxygen species in the presence of oxygen and water to exert some effects on the chemical structures of organic compounds. In the present invention, such a carrier is assumed to exert some effects on compounds in the characteristic-changeable layer which is brought into contact on the photocatalyst-containing layer.

A photocatalyst employed in the present invention may for example be one known as a photosemiconductor such as titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$) and iron oxide ($Fe_2O_3$), any of which can be employed alone or in combination with each other.

In the present invention, a titanium oxide is especially preferred since it has a high band gap energy and is stable chemically and non-toxic, and also readily available. Titanium oxides can be grouped into anatase type and rutile type, both of which can be employed in the invention, with a titanium oxide of the anatase type being preferred. The excitation wavelength of an anatase titanium oxide is 380 nm or less.

Such an anatase titanium oxide may for example be hydrochloric acid-deswelling anatase-type titania sol (Ishihara Sangyo Kaisha, Ltd., STS-02 (mean particle size: 7 nm), Ishihara Sangyo Kaisha Ltd., ST-K01), nitric acid-deswelling anatase-type titania sol (Nissan Chemical Industries, Ltd., TA-15 (mean particle size: 12 nm) and the like.

A smaller particle size of a photocatalyst is more preferred because of a higher efficiency of the photocatalytic reaction, with a mean particle size of 50 nm or less being preferred, 20 nm or less being particularly preferred.

A photocatalyst-containing layer in the present invention may be formed only from a photocatalyst or may be formed from a mixture with a binder.

In the case of a photocatalyst-containing layer formed only from a photocatalyst, the efficiency in response to the change in the characteristics of a characteristic-changeable layer is improved, resulting in an advantageously reduced cost due to a reduced treatment time period and the like. On the other hand, a photocatalyst-containing layer comprising a photocatalyst and a binder is also advantageous since it allows the photocatalyst-containing layer to be formed readily.

A method for producing a photocatalyst-containing layer consisting only of a photocatalyst may for example be a vacuum film-forming method such as a sputtering method, CVD method, vacuum vapor deposition method and the like. By forming a photocatalyst-containing layer by a vacuum film-forming method, it is possible to obtain a uniform photocatalyst-containing layer which contains only a photocatalyst, which allows the characteristics on a characteristic-changeable layer to be changed uniformly, and the use only of the photocatalyst enables a more efficient change in the characteristics on the characteristic-changeable layer when compared to the use in combination with a binder.

A method for producing a photocatalyst-containing layer consisting only of a photocatalyst, in the case for example that the photocatalyst is a titanium oxide, involves the formation of an amorphous titania on a substrate followed by the phase transition to a crystalline titania by calcination. Such an amorphous titania employed here can be obtained for example by hydrolysis or dehydrating condensation of an inorganic salt of a titanium such as titanium tetrachloride and titanium sulfate, or by hydrolysis or dehydrating condensation of an organic titanium compound such as tetraethoxytitanium, tetraisopropoxytitanium, tetra-n-propoxytitanium, tetrabutoxytitanium and tetramethoxytitanium in the presence of an acid. Subsequently, the resultant titania may be sintered at 400 to 500° C. to convert into an anatase titania or at 600 to 700° C. to convert into an rutile titania.

When using a binder, a binder having a high binding energy sufficient to prevent the decomposition of its backbone by the photoexcitation of the photocatalyst is preferred, such as an organopolysiloxane which is detailed below in the section of a characteristic-changeable layer.

When such an organopolysiloxane is employed as a binder, a photocatalyst-containing layer described above can be formed by dispersing a photocatalyst and an organopolysiloxane as a binder if necessary together with other additives in a solvent to prepare a coating solution, followed by coating this coating solution on a substrate. The solvent employed here is preferably an alcoholic solvent such as ethanol and isopropanol. The coating may be accomplished by a known coating method such as spin coat, spray coat, dip coat, roll coat, and beads coat. When a component of UV setting type is contained as a binder, a photocatalyst-containing layer can be formed by irradiating a UV ray to effect setting.

An amorphous silica precursor may be employed also as a binder. Such an amorphous silica precursor is preferably a silicon compound represented by Formula: $SiX_4$, where X is a halogen, methoxy group, ethoxy group, or acetyl group, a hydrolysate thereof, i.e., silanol, or a polysiloxane whose mean molecular weight is 3000 or less.

Those mentioned typically are tetraethoxysilane, tetraisopropoxysilane, tetra-n-propoxysilane, tetrabutoxysilane, tetramethoxysilane and the like. In this case, a photocatalyst-containing layer can be formed by dispersing an amorphous silica precursor and the particle of a photocatalyst uniformly in a non-aqueous solvent followed by a hydrolysis by water contained in air to form a silanol on a transparent substrate followed by a dehydrating condensation polymerization at room temperature. By conducting the dehydrating condensation polymerization at 100° C. or higher, the polymerization degree of the silanol is increased, whereby improving the strength of the film surface. Each of the binders listed above may be employed alone or in combination.

The photocatalyst content in a photocatalyst-containing layer when using a binder is 5 to 60% by weight, preferably 20 to 40% by weight. The thickness of the photocatalyst-containing layer is preferably within the range from 0.05 to 10 μm.

A photocatalyst-containing layer may contain a surfactant in addition to a photocatalyst and a binder described above. Those exemplified typically are hydrocarbon-based surfactants such as each series of NIKKOL BL, BC, BO and BB (Nikko Chemicals Co., Ltd.) and fluorine-based or silicone-based nonionic surfactants such as ZONYL FSN and FSO (Du Pont Kabushiki Kaisha), Surflon S-141 and 145 (Asahi Glass Company), MEGAFACE-141 and 144 (Dainippon Ink and Chemicals, Incorporated), Ftergent F-200 and F251 (NEOS CORPORATION.), UNIDYNE DS-401 and 402 (DAIKIN INDUSTRIES, Ltd.), FLOLADE FC-170 and 176 (3M) and the like, as well as cationic surfactants, anionic surfactants and zwitterionic surfactants.

In addition to the surfactants listed above, oligomers and polymers of polyvinyl alcohols, unsaturated polyesters, acrylic resins, polyethylenes, diallyl phthalate, ethylenepropylenediene monomer, epoxy resins, phenol resins, polyurethane, melamine resins, polycarbonates, polyvinyl chlorides, polyamides, polyimides, styrene-butadiene rubbers, chloroprene rubbers, polypropylenes, polybutylenes, polystyreness, polyvinyl acetates, polyesters, polybutadienes, polybenzimidazoles, polyacrylonitriles, epichlorohydrins, polysulfites, polyisoprenes and the like may also be contained in a photocatalyst-containing layer.

(Substrate)

In present the invention, as shown in FIG. 1A, a photocatalyst-containing layer-sided substrate 3 has at least a substrate 1 and a photocatalyst-containing layer 2 formed on this substrata 1.

Since this substrate eliminates the need of transmitting any light upon exposure as shown also in FIG. 1C, its material is not limited particularly and may be any material as desired. Nevertheless, since this photocatalyst-containing layer-sided substrate is used repetitively in the invention, a material having a certain strength whose surface can be in close contact with the photocatalyst-containing layer is employed preferably.

Those exemplified typically are glasses, ceramics, metals, plastics and the like.

For the purpose of improving the close contact between the surface of a substrate and a photocatalyst-containing layer, a primer layer may be formed on the substrate. Such a primer layer may for example be of silane-based and titanium-based coupling agents.

2. Pattern-forming Body Substrate

Figure 2:
FIG. 2 is an outlined sectional view indicating an example of a pattern-forming body substrate employed in the method for producing a pattern-forming body of the present invention.

A pattern-forming body substrate employed in the present invention is discussed below. A pattern-forming body substrate employed in the invention is not limited particularly provided that it has at least a characteristic-changeable layer and a light-shading part formed as a pattern. As shown in FIG. 1A as an example, a transparent substrate 4 may has a light-shading part 5 formed thereon, further on which a characteristic-changeable layer 6 is formed to give a pattern-forming body substrate 7 (hereinafter referred to as Embodiment 1), or, alternatively as shown in FIG. 2, where the characteristic-changeable layer has a self supporting property the light-shading part 5 may be formed on the characteristic-changeable layer 6 to give the pattern-forming body substrate 7 (hereinafter referred to as Embodiment 2).

Each embodiment is discussed below separately.

(1) Embodiment 1

Embodiment 1 of a pattern-forming body substrate of the present invention relates to a pattern-forming body substrate having a characteristic-changeable layer, a light-shading part, and a transparent substrate. Each component is discussed below.

(Characteristic-changeable Layer)

A characteristic-changeable layer of this embodiment is discussed first. A characteristic-changeable layer of this embodiment is not limited particularly provided that its characteristics are changed by the effect of a photocatalyst-containing layer described above. For example, the characteristic-changeable layer may be converted to a layer that can be colored by the effect of the photocatalyst by admixing a photochromic material such as spiropyran or an organic dye decomposable by the effect of the photocatalyst with the characteristic-changeable layer.

It is also possible to use as a characteristic-changeable layer a layer whose adhesiveness to various materials is improved as a result of the introduction of a polar group or of the surface condition imparted with a roughness by the effect of a photocatalyst in an exposed part by using a polymeric material such as a polyolefin including polyethylenes and polypropylenes. By employing as a characteristic-changeable layer an adhesion-changeable layer whose adhesiveness is changed, a pattern having a satisfactory adhesiveness can be formed by a pattern exposure. A pattern-forming body having a pattern of such a satisfactorily adhesive part enables the formation of a metal thin film pattern for example by depositing a metal component to such a pattern-forming body to form a metal thin layer followed by utilizing the difference in the adhesiveness to peel the metal thin film for example by means of adhesive agents or other reagents. By this method, a metal thin film pattern can be formed without forming a resist pattern, whereby enabling the formation of a print board or electronic circuit element whose pattern is further minute when compared with those obtained by a printing process.

Also in this embodiment, such a characteristic-changeable layer may be one formed by a dry process, i.e., a vacuum vapor deposition and the like, or by a wet process, i.e., a spin coat or dip coat process.

While a characteristic-changeable layer is not limited particularly provided that it has various characteristics which are changed by the effect of a photocatalyst, the following two cases, i.e., the case where the characteristic-changeable layer is a wettability-changeable layer whose wettability is changed by the effect of the photocatalyst to form a wettability-based pattern and the case where the characteristic-changeable layer is a decomposition-removable layer which is decomposed and removed by the effect of the photocatalyst to form an irregular pattern are preferred particularly in this embodiment since they realize the effectiveness of this embodiment especially in view of the resultant functional elements and the like.

Such wettability-changeable layer and decomposition-removable layer are discussed below.

a. Wettability-changeable Layer

While a wettability-changeable layer in this embodiment is not limited particularly provided that it is a layer whose surface undergoes the change in the wettability by the effect of a photocatalyst described above, it is preferably a layer whose wettability is changed in such a manner that the contact angle with a liquid on the surface of the wettability-changeable layer is reduced by the effect of the photocatalyst upon exposure.

It should be made from a material enabling the transmission of an energy capable of activating a photocatalyst in a photocatalyst-containing layer which is in contact.

Thus, by employing a wettability-changeable layer whose wettability is changed in such a manner that the contact angle with a liquid is reduced upon exposure (to the irradiation not only with light but also with energy in this embodiment), the exposure through the light-shading part described above allows the wettability to be changed readily in a pattern whereby forming a pattern of the lyophilic region whose contact angle with a liquid is low, to which a composition for the functional part is then deposited, whereby allowing a functional element to be obtained easily. Thus, the functional element can efficiently be produced, resulting in an advantageous cost efficiency.

A lyophilic region mentioned here means a region where the contact angle with a liquid is low, i.e., a region which is readily wet with a composition for the functional part, including an ink for coloring a pixel part (colored part) for example when the functional element is a color filter and a microlens-forming composition when the functional element is a microlens. A lyophobic region means a region where the contact angle with a liquid is high, i.e., a region which is poorly wet with a composition for the functional part described above.

In this embodiment, a region is referred to as a lyophilic region when the contact angle with a liquid is lower by 1° or more than the contact angle with a liquid in the adjacent region, while it is referred to as a lyophobic region when the contact angle with a liquid is higher by 1° or more than the contact angle with a liquid in the adjacent region.

A wettability-changeable layer has a wettability in a non-exposed region, i.e., in a lyophobic region, which gives a contact angle with a liquid whose surface tension is 40 mN/m of 10° or more, preferably a contact angle with a liquid whose surface tension is 30 mN/m of 10° or more, particularly a contact angle with a liquid whose surface tension is 20 mN/m of 10° or more. Since a non-exposed part should have a lyophobic property in this embodiment, a low contact angle with a liquid results in an insufficient lyophobic effect, which may lead to a problematic remaining of a composition for the functional part described above.

A wettability-changeable layer is preferably a layer which undergoes a reduction in the contact angle with a liquid upon exposure to give a contact angle with a liquid whose surface tension is 40 mN/m of 9° or less, preferably a contact angle with a liquid whose surface tension is 50 mN/m of 10° or less, particularly a contact angle with a liquid whose surface tension is 60 mN/m of 10° or less. Since a high contact angle in an exposed part, i.e., a lyophilic region, may lead to a poor spreading of a composition for the functional part in this part, resulting in a problem for example due to defect of the functional part.

The contact angle with a liquid mentioned here is based on the results or on a graph from such results obtained by measuring the contact angles with liquids having various surface tensions (30 seconds after dropping a liquid from a microsyringe) using a contact angle measuring instrument (Kyowa Interface Science Co., LTD., model CA-Z). Liquids having various surface tensions employed in this measurement we employed were the wettability index standard solutions produced by JUNSEI CHEMICAL CO., LTD.

Also when using a wettability-changeable layer described above in this embodiment, this wettability-changeable layer may further contain fluorine, and such a wettability-changeable layer has been formed in such a manner that the fluorine content on the surface of this wettability-changeable layer is reduced upon exposure of the wettability-changeable layer by the effect of a photocatalyst described above when compared with the content before exposure.

Such characteristics of a wettability-changeable layer allow a pattern of a less fluorine content to be formed readily by a pattern irradiation of energy. The fluorine employed here has an extremely low surface energy, which gives a lower critical surface tension of the surface of a fluorine-rich substance. Accordingly, the critical surface tension of a fluorine-poor region becomes greater than the critical surface tension of a fluorine-rich surface. This means that the fluorine-poor part becomes a relatively more lyophilic region when compared with the fluorine-rich part. Therefore, to form a pattern of a fluorine-poor part when compared with surrounding surface is to form a pattern of a lyophilic region within a lyophobic region.

Accordingly, when employing such a wettability-changeable layer, a pattern irradiation of energy allows a pattern of a lyophilic region to be formed readily within a lyophobic region, whereby facilitating the formation of a functional part exclusively within this lyophilic region, resulting in a cost-efficient functional element having a satisfactory quality.

The fluorine content of a fluorine-containing wettability-changeable layer described above in a fluorine-poor lyophilic region formed by exposure is 10 or less, preferably 5 or less, more preferably 1 or less, based on 100 as the fluorine content in a non-exposed region.

A content within the range specified above allows the wettability to be different substantially between an exposed part and a non-exposed part. Accordingly, by forming a functional part in such a wettability-changeable layer, it is possible to form the functional part correctly only within a lyophilic region whose fluorine content is reduced, whereby enabling a production of a functional element at a high accuracy. Any reduction in the content mentioned here is based on weight.

The measurement of the fluorine content of the wettability-changeable layer can be accomplished by various methods employed ordinarily, and any method capable of quantifying fluorine on a surface can be employed such as X-ray photoelectron spectroscopy also referred to as ESCA (electron spectroscopy for chemical analysis), fluorescent X-ray analysis, mass spectroscopy and the like.

While a material employed in such a wettability-changeable layer is not limited particularly provided that it undergoes a change in the characteristics of the wettability-changeable layer described above, i.e., the change in the wettability, by the effect of a photocatalyst in a photocatalyst-containing layer which becomes in contact with exposure and also provided that it has a backbone which is not degraded or decomposed readily by the effect of the photocatalyst, those exemplified are (1) an organopolysiloxane which exerts a substantial strength obtained by hydrolysis or polymerization condensation of chloro- or alkoxysilane in a sol-gel reaction, and (2) an organopolysiloxane such as an organopolysiloxane crosslinked with a reactive silicone which has excellent water-repelling or oil-repelling property.

A substance (1) described above is preferably an organopolysiloxane which is a hydrolytic condensate or a hydrolytic co-condensate of one or more silicon compounds represented by Formula:

$$Y_nSiZ_{(4-n)}$$ 

wherein Y denotes an alkyl group, fluoroalkyl group, vinyl group, amino group, phenyl group or epoxy group, X denotes an alkoxyl group, acetyl group or halogen, and n denotes an integer of 0 to 3. The number of carbon atoms in a group represented by Y is preferably 1 to 20, and the alkoxy group represented by X is preferably a methoxy group, ethoxy group, propoxy group, and butoxy group.

Those exemplified typically are methyltrichlorosilane, methyltribromosilane, methyltrimethoxysilane, methyltriethoxysilane, methyltriisopropoxysilane, methyltri-t-butoxysilane; ethyltrichlorosilane, ethyltribromosilane, ethyltrimehtoxysilane, ethyltriethoxysilane, ethyltriisopropoxysilane, ethyltri-t-butoxysilane; n-propyltrichlorosilane, n-propyltribromosilane, n-propyltrimethoxysilane, n-propyltriethoxysilane, n-propytriisopropoxysilane, n-propyltri-t-butoxysilane; n-hexyltrichlorosilane, n-hexyltribromosilane, n-hexyltrimethoxysilane, n-hexyltriethoxysilane, n-propytriisopropoxysilane, n-hexyltri-t-butoxysilane; n-decyltrichlorosilane, n-decyltribromosilane, n-decyltrimethoxysilane, n-decyltriethoxysilane, n-decyltriisopropoxysilane, n-decyltri-t-butoxysilane; n-octadecyltrichlorosilane, n-octadecyltribromosilane, n-octadecyltrimethoxysilane, n-octadecyltriethoxysilane, n-octadecyltriisopropoxysilane, n-octadecyltri-t-butoxysilane; phenyltrichlorosilane, phenyltribromosilane, phenyltrimethoxysilane, phenyltriethoxysilane, propytriisopropoxysilane, phenyltri-t-butoxysilane; tetrachlorosilane, tetrabromosilane, tetramethoxysilane, tetraethoxysilane, tetrabutoxysilane, dimethoxydiethoxysilane; dimethyldichlorosilane, dimethyldibromosilane, dimethyldimethoxysilane, dimethyldiethoxysilane; diphenyldithlorosilane, diphenyldibromosilane, diphenyldimehtoxysilane, diphenyldiethoxysilane; phenylmethyldichlorosilane, phenylmethyldibromosilane, phenylmethyldimethoxysilane, phenylmethyldiethoxysilane; trichlorohydrosilane, tribromohydrosilane, trimethoxyhydrosilane, triethoxyhydrosilane, triisopropoxyhydrosilane, tri-t-butoxyhydrosilane; vinyltrichlorosilane, vinyltribromosilane, vinyltrimehtoxysilane, vinyltriethoxysilane, vinyltriisopropoxysilane, vinyltri-t-butoxysilane; trifluoropropyltrichlorosilane, trifluoropropyltribromosilane, trifluoropropyltrimehtoxysilane, trifluoropropyltriethoxysilane, trifluoropropyltriisopropoxysilane, trifluoropropyltri-t-butoxysilane; γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri-t-butoxysilane; γ-methacryloxypropylmethyldimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, γ-methacryloxypropyltri-t-butoxysilane; γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri-t-butoxysilane; γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyltri-t-butoxysilane; β-(3,4-epoxycyclohexy)ethyltrimethoxysilane, β-(3,4-epoxycyclohexy)ethyltriethoxysilane; and partial hydrolysates thereof as well as mixture thereof.

A fluoroalkyl group-containing organopolysiloxane is especially preferred, and those exemplified typically are hydrolytic condensates or hydrolytic co-condensates of one or more fluoroalkylsilicon compounds listed below and those known generally as fluorine-based silane coupling agents can be employed.

$CF_3(CF_2)_3CH_2CH_2Si(OCH_3)_3$;
$CF_3(CF_2)_5CH_2CH_2Si(OCH_3)_3$;
$CF_3(CF_2)_7CH_2CH_2Si(OCH_3)_3$;
$CF_3(CF_2)_9CH_2CH_2Si(OCH_3)_3$;
$(CF_3)_2CF(CF_2)_4CH_2CH_2Si(OCH_3)_3$;
$(CF_3)_2CF(CF_2)_6CH_2CH_2Si(OCH_3)_3$;
$(CF_3)_2CF(CF_2)_8CH_2CH_2Si(OCH_3)_3$;
$CF_3(C_6H_4)C_2H_4Si(OCH_3)_3$;
$CF_3(CF_2)_3(C_6H_4)C_2H_4Si(OCH_3)_3$;
$CF_3(CF_2)_5(C_6H_4)C_2H_4Si(OCH_3)_3$;
$CF_3(CF_2)_7(C_6H_4)C_2H_4Si(OCH_3)_3$;
$CF_3(CF_2)_3CH_2CH_2SiCH_3(OCH_3)_2$;
$CF_3(CF_2)_5CH_2CH_2SiCH_3(OCH_3)_2$;
$CF_3(CF_2)_7CH_2CH_2SiCH_3(OCH_3)_2$;
$CF_3(CF_2)_9CH_2CH_2SiCH_3(OCH_3)_2$;
$(CF_3)_2CF(CF_2)_4CH_2CH_2SiCH_3(OCH_3)_3$;
$(CF_3)_2CF(CF_2)_6CH_2CH_2SiCH_3(OCH_3)_3$;
$(CF_3)_2CF(CF_2)_8CH_2CH_2SiCH_3(OCH_3)_3$;
$CF_3(C_6H_4)C_2H_4SiCH_3(OCH_3)_2$;
$CF_3(CF_2)_3(C_6H_4)C_2H_4SiCH_3(OCH_3)_2$;
$CF_3(CF_2)_5(C_6H_4)C_2H_4SiCH_3(OCH_3)_2$;
$CF_3(CF_2)_7(C_6H_4)C_2H_4SiCH_3(OCH_3)_2$;
$CF_3(CF_2)_3CH_2CH_2Si(OCH_2CH_3)_3$;
$CF_3(CF_2)_5CH_2CH_2Si(OCH_2CH_3)_3$;
$CF_3(CF_2)_7CH_2CH_2Si(OCH_2CH_3)_3$;
$CF_3(CF_2)_9CH_2CH_2Si(OCH_2CH_3)_3$; and,
$CF_3(CF_2)_7SO_2N(C_2H_5)C_2H_4CH_2Si(OCH_3)_3$.

By using a fluroalkyl group-containing polysiloxane as a binder, the lyophobic property of a non-exposed part of a wettability-changeable layer is improved greatly, whereby exerting a function for preventing the deposition of a composition for the functional part such as an ink for coloring a pixel part for example in the case where the functional element is a color filter.

As a reactive silicone (2) described above, a compound having a backbone represented by Formula:

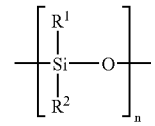

wherein n is an integer of 2 or more, each of $R^1$ and $R^2$ is a substituted or unsubstituted alkyl, alkenyl, aryl, or cyanoalkyl group having 1 to 10 carbon atoms provided that 40% by mole or less of the total is vinyl, phenyl, and halogenated phenyl. A compound whose $R^1$ and $R^2$ are methyl groups is preferred because of its lowest surface energy, with the methyl group present in an amount of 60% by mole or more being preferred. The terminal of the chain or side chain has at least one reactive group such as a hydroxyl group in its molecule chain.

An organopolysiloxane described above maybe mixed with a stable organosilicone compound which undergoes no crosslinking, such as a dimethylpolysiloxane.

While this embodiment can employ various materials such as organopolysiloxanes in a wettability-changeable layer, it is effective for a wettable pattern formation to introduce fluorine to the wettability-changeable layer. Accordingly, it is preferred to introduce a fluorine to a material which is difficult to be deteriorated or decomposed by the effect of a photocatalyst, and more typically, it is preferred to introduce fluorine to an organopolysiloxane material to form a wettability-changeable layer.

A method for incorporating fluorine to an organopolysiloxane material may for example be a method in which fluorine is bound with a relatively low binding energy to an ingredient usually having a high binding energy or a method in which a fluorine compound bound with a relatively low binding energy is admixed into a wettability-changeable layer. By introducing fluorine by such a method, the fluorine binding site at which the binding energy is relatively low is decomposed first upon exposure, whereby eliminating the fluorine from a wettability-changeable layer.

The first method described above, i.e., the method in which fluorine is bound with a relatively low binding energy to a binder having a high binding energy, may for example be a method in which a fluoroalkyl group is introduced as a substituent into an organopolysiloxane described above.

In a method for obtaining an organopolysiloxane, an organopolysiloxane exerting a substantial strength can be obtained by hydrolysis or polymerization condensation of chloro- or alkoxysilane in a sol-gel reaction as described above in (1). While in such a method an organopolysiloxane is obtained by subjecting one or more of silicon compounds represented by Formula:

$Y_nSiZ_{(4-n)}$ wherein Y denotes an alkyl group, fluoroalkyl group, vinyl group, amino group, phenyl group or epoxy group, X denotes an alkoxyl group, acetyl group or halogen, and n denotes an integer of 0 to 3 to a hydrolytic condensation or hydrolytic co-condensation, an organopolysiloxane having a fluoroalkyl group as a substituent can be obtained by conducting the synthesis using a silicon compound having a fluoroalkyl group as a substituent Y. When using as a binder such an organopolysiloxane having a fluoroalkyl group as a substituent, the carbon bond of the fluoroalkyl group is decomposed, upon exposure, by the effect of a photocatalyst contained in a photocatalyst-containing layer which is in contact, whereby reducing the fluorine content of an exposed part in a wettability-changeable layer.

While a fluoroalkyl group-containing silicon compound employed here is not limited particularly provided that it has a fluoroalkyl group, it is preferably a silicon compound which has at least one fluoroalkyl group and whose fluoroalkyl group has 4 to 30, preferably 6 to 20, more preferably 6 to 16 carbon atoms. Examples of such a silicon compound are as described above, and a silicon compound whose fluoroalkyl group has 6 to 8 carbon atoms, i.e., a fluoroalkylsilane, is preferred.

In this embodiment, a silicon compound having such a fluoroalkyl group may be combined with a silicon compound containing no fluoroalkyl group described above to employ its hydrolytic co-condensate as an olganopolysiloxane, or one or more of the fluoroalkyl group-containing silicon compounds are combined to employ their hydrolytic condensate or hydrolytic co-condensate as an olganopolysiloxane.

In a fluoroalkyl group-containing organopolysiloxane thus obtained, a fluoroalkyl group-containing silicon compound described above is present in an amount of 0.01% by mol or more, preferably 0.1% by mol or more based on the silicon compounds as constituents of this organopolysiloxane.

By containing the fluoroalkyl group in an amount specified above, the lyophobic ability on a wettability-changeable layer is increased, whereby increasing the difference in the wettability from that in an exposed lyophilic region.

While in the method of (2) described above an organopolysiloxane is obtained by crosslinking a highly lyophobic reactive silicone, it is similarly possible also in this case to incorporate fluorine into a wettability-changeable layer by employing fluorine-containing substituents as one or both of $R^1$ and $R^2$ in the formula shown above, and it is also possible that the fluorine content on the surface of the wettability-changeable layer can be reduced by exposure since the decomposition occurs upon exposure at the fluoroalkyl group whose binding energy is lower than a siloxane bond.

On the other hand, the latter method where a fluorine compound bound with a lower energy than the binding energy of a binder may for example be a method in which a fluorine-based surfactant is introduced when a low molecular weight fluorine compound is intended to be incorporated, or a method in which a fluorine resin whose compatibility with a binder resin is high is incorporated when a high molecular weight fluorine compound is intended to be incorporated.

A wettability-changeable layer in this embodiment can further contain surfactants. Those exemplified typically are hydrocarbon-based surfactants such as each series of NIKKOL BL, BC, BO and BB (Nikko Chemicals Co., Ltd.) and fluorine-based or silicone-based nonionic surfactants such as ZONYL FSN and FSO (Du Pont Kabushiki Kaisha), Surflon S-141 and 145 (Asahi Glass Company), MEGAFACE-141 and 144 (Dainippon Ink and Chemicals, Incorporated), Ftergent F-200 and F251 (NEOS CORPORATION.), UNIDYNE DS-401 and 402 (DAIKIN INDUSTRIES, Ltd.), FLOLADE FC-170 and 176 (3M) and the like, as well as cationic surfactants, anionic surfactants and zwitterionic surfactants.

In addition to the surfactants listed above, oligomers and polymers of polyvinyl alcohols, unsaturated polyesters, acrylic resins, polyethylenes, diallyl phthalate, ethylenepropylenediene monomer, epoxy resins, phenol resins, polyurethane, melamine resins, polycarbonates, polyvinyl chlorides, polyamides, polyimides, styrene butadiene rubbers, chloroprene rubbers, polypropylenes, polybutylenes, polystyreness, polyvinyl acetates, polyesters, polybutadienes, polybenzimidazoles, polyacrylonitriles, epichlorohydrins, polysulfites, polyisoprenes and the like may also be contained in a wettability-changeable layer.

Such a wettability-changeable layer can be formed by dispersing the components described above if necessary together with other additives in a solvent to prepare a coating solution, followed by coating this coating solution on a substrate. The solvent employed here is preferably an alcoholic solvent such as ethanol and isopropanol. The coating may be accomplished by a known coating method such as spin coat, spray coat, dip coat, roll coat and bead coat. When a component of UV setting type is contained, a wettability-changeable layer can be formed by irradiating a UV ray to effect setting.

In this embodiment, the thickness of a wettability-changeable layer is preferably 0.001 µm to 1 µm in view of the rate of the change in the wettability by a photocatalyst, more preferably 0.01 to 0.1 µm.

In the present invention, by employing a wettability-changeable layer having the components described above, the wettability of an exposed part is changed to be lyophilic by the effect of the oxidation and degradation of the organic groups as parts of the components and additives described above as a result of the activity of a photocatalyst contained in a photocatalyst-containing layer in contact, whereby obtaining a substantial difference in the wettability from a non-exposed part. Accordingly, the resultant increase in the ability of receiving (lyophilic) and repelling (lyophobic) a composition for the functional part such as an ink for coloring a pixel part enables the production of a high quality and cost efficient functional element, such as a color filter.

A wettability-changeable layer employed in this embodiment may be of a self supporting or non-self supportive material provided that it is made from a material provided that it is made from a material whose surface wettabilty can be changed by the effect of a photocatalyst. The self supporting material mentioned in this embodiment means a material capable of existing in a shape without a support.

In this embodiment, a non-self supporting wettability-changeable layer is preferred. A wettability-changeable layer formed from a material undergoing a substantial change in the characteristics described above is poorly self-supportive in general, and becomes useful as a pattern-forming body by being formed on a transparent substrate to enhance the mechanical strength.

While a wettability-changeable layer employed in this embodiment is not limited particularly provided that its wettability is changed by the effect of a photocatalyst described above, it is preferably a layer containing no photocatalyst. The absence of any photocatalyst in the wettability-changeable layer enables a prolonged satisfactory use of a functional element, which is produced subsequently, without any adverse sustained effect of the photocatalyst.

(Decomposition-removable Layer)

A decomposition-removable layer is discussed below. A decomposition-removable layer employed in this embodiment is not limited particularly provided that it is a layer in which a decomposition-removable layer in an exposed part is decomposed and removed upon exposure by the effect of a photocatalyst in a photocatalyst-containing layer.

Since in such a decomposition-removable layer an exposed part is decomposed and removed by the effect of a photoctalyst, it is possible to form a pattern comprising both of the parts with and without the decomposition-removable layer, i.e., an irregular pattern, without conducting developing or washing process.

Also since this decomposition-removable layer is oxidized by the effect of a photocatalyst upon an exposure to be vaporized, it can be removed without any particular post-treatments such as developing or washing process, but it may be washed depending on the material for the decomposition-removable layer.

A decomposition-removable layer employed in this embodiment is preferably not only an irregular-forming layer but also a layer whose contact angle with a liquid is higher when compared with a transparent substrate described above. By such characteristics, it is possible to obtain as a lyophilic region a region where the decomposition-removable layer is decomposed and removed to allow the transparent substrate to come out and as a lyophobic region a region where the decomposition-removable layer is remaining, whereby enabling the formation of various patterns.

It is preferable here that the decomposition-removable layer of this embodiment gives a contact angle with a liquid whose surface tension is 40 mN/m of 10° or more, preferably a contact angle with a liquid whose surface tension is 30 mN/m of 10° or more, particularly a contact angle with a liquid whose surface tension is 20 mN/m of 10° or more.

In this embodiment, when a characteristic-changeable layer is decomposition-removable layer, then it is preferable that a transparent substrate described below is lyophilic, typically giving a contact angle with a liquid whose surface tension is 40 mN/m of 9° or less, preferably a contact angle with a liquid whose surface tension is 40 mN/m of 5° or less, particularly 1° or less.

By adjusting the wettability of a decomposition-removable layer and a transparent substrate within the ranges specified above, it is possible to form as a lyophilic region a region where the transparent substrate comes out and as a lyophobic region a region where the decomposition-removable layer is remaining, whereby enabling the formation of a highly minute pattern. The contact angle mentioned here means the value measured as described above.

The transparent substrate here may be one whose surface has been treated to impart a lyophilicity. Examples of those whose surfaces are treated to impart a lyophilicity are those treated lyophilically by plasma treatment utilizing argon or water, and a lyophilic layer formed on a transparent substrate may for example be a silica film obtained by subjecting tetraethoxysilane to a sol-gel process. In this embodiment, the part where the transparent substrate comes out serves as a lyophilic region.

A film which can be employed as a decomposition-removable layer described above may typically be a film of a fluorine-based or hydrocarbon-based resin having a lyophobic ability. Such a fluorine-based or hydrocarbon-based resin is not limited particularly provided that it has a lyophobic ability, and such a resin is dissolved in a solvent and formed into a film by an ordinary film-forming method such as a spin coating process.

Also in this embodiment, a functional thin film, i.e., a self-assembled monolayer, Langmuir-Blodgett film or layer-by-layer self-assembled film can be employed to form a film having no defects, and such a film-forming method is employed preferably.

A self-assembled monolayer, Langmuir-Biodgett film and layer-by-layer self-assembled film employed in this embodiment are described in detail below.

(i) Self-assembled Monolayer

While we do not know the existence of any official definition of a self-assembled monolayer, Abraham Ulman's "Formulation and Structure of Self-Assembled Monolayers", Chemical Review, 96, 1533–1554 (1996) is an excellent textbook discussing those recognized generally as self-assembled monolayers. Based on this textbook, a self-assembled monolayer is a monomolecular layer resulting from the absorption and binding (self-assembling) of a suitable molecule onto the surface of a suitable substrate. A material having a self-assembled monolayer-forming ability may for example be a surfactant molecule such as fatty acids, an organic silicon molecule such as alkyltrichlorosilanes and alkylalkoxides, an organic sulfur molecule such as alkanethiols, and an organic phosphorus molecule such as alkyl phosphates. A common aspect of the molecular structures is a relatively long alkyl chain and one end of each molecule having a functional group which interact with the surface of a substrate. The alkyl chain moiety is the source of the intermolecular force for a secondary packing between molecules. The structure exemplified here is the most simple one, and self-assembled monolayers comprising various molecules have been reported including a molecule having a functional group such as an amino or carboxyl group on one end of the molecule and a molecule whose alkylene chain moiety is an oxyethylene chain, fluorocarbon chain, or a mixture thereof. A composite self-assembled monolayer comprising several molecular species is also present. Furthermore, a particulate polymer having several functional group (sometimes single functional group) such as dendrimer or a linear polymer (sometimes containing branches) which has been formed on the surface of a single-layer substrate (the latter is referred to generally as polymer brush) is regarded sometimes also as a self-assembled monolayer. Such a film is included in self-assembled monolayers in this embodiment.

(ii) Langmuir-Blodgett Film

A Langmuir-Blodgett film employed in this embodiment does not have any significant morphological difference from a self-assembled monolayer described above once formed on a substrate. The Langmuir-Blodgett film is characterized by the production method and the highly packed (highly oriented, highly ordered) secondary molecules resulting from such a production method. Thus, in general, a Langmuir-Blodgett film is expanded first on a gas-liquid interface, and the expanded film is condensed by a trough to change into a highly packed condensed film. Actually, this condensed film is transferred onto a suitable substrate and then used. By means of a procedure outlined here, it is possible form a monomolecular film or multilayer film having suitable number of layers. It is also possible to use not only a low molecular weight material but also a high molecular weight material or colloidal particle as a material for producing a film. Current applications of various materials are discussed in N.MIYAJI, "Potential of soft-based nanodevice production in nanotechnology", KOBUNSHI, Vol.50, September issue, p 644–647 (2001).

(iii) Layer-by-layer Self-assembled Film

A layer-by-layer self-assembled film is a form formed generally by allowing a material having a functional group carrying at least two positive or negative charge to be adsorbed and deposited sequentially to form a lamination.

Since a material having a large number of functional groups is advantageous for example due to an increased strength or durability of the film, an ionic polymer (polymeric electrolyte) is employed frequently as a material in these days. A particle having a surface charge such as proteins, metals, and oxides, i.e., "colloidal particle", is employed widely as a film-forming material. Recently, a film utilizing an interaction which is even weaker than that of ionic bond, such as hydrogen bond, coordinate bond, hydrophobic interaction and the like was also reported. Relatively current text of layer-by-layer self-assembled film is detailed in Paula T. Hammomd, "Recent Explorations in Electrostatic Multilayer Thin Film Assembly", Current Opinion in Colloid & Interface Science, 4, 430–442 (2000) although the discussion focuses on the materials whose driving forces are electrostatic interactions. A layer-by-layer self-assembled film for example in the simplest process is a film formed by performing the cycle of positively (negatively) charged material adsorption-washing-negatively (positively) charged material adsorption-washing several times repetitively. There is no need of the procedure of expansion-condensation-transfer as is conducted for a Langmuir-Blodgett film. As evident from the difference in the production method described above, a layer-by-layer self-assembled film generally does not have a two-dimensional highly orienting and highly ordering property as is observed with a Langmuir-Blodgett film. Nevertheless, a layer-by-layer self-assembled film and a method for producing the same are advantageous greatly when compared with conventional film-forming methods, since they allow a minute film without defects to be formed readily and also allow a film to be formed uniformly even on a fine irregular-carrying surface, inner wall of a tube or spherical surface.

The thickness of a decomposition-removable layer is not limited particularly provided that it enables the decomposition and removal by the energy irradiated in an exposure process described below. While the typical film thickness may vary greatly depending on the type of the energy irradiated or the material for the decomposition-removable layer, it is usually 0.001 µm to 1 µm, preferably 0.01 µm to 0.1 µm.

(Light-shading Part)

A light-shading part is described below.

Figure 3:
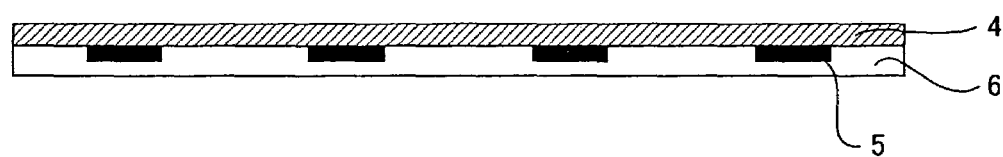
FIG. 3 is an outlined sectional view indicating another example of a pattern-forming body substrate employed in the method for producing a pattern-forming body of the present invention.
Figure 4:
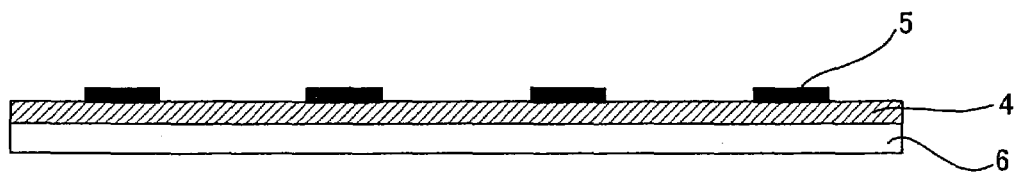
FIG. 4 is an outlined sectional view indicating still another example of a pattern-forming body substrate employed in the method for producing a pattern-forming body of the present invention.

A light-shading part employed in this embodiment is formed, as shown for example in FIG. 3 and FIG. 4, as a pattern in the site corresponding to the position where a light-shading part 5 allows a surface of a characteristic-changeable layer 6 on a transparent substrate 4 to be a non-exposed part. In this embodiment, the position where the light-shading part is formed can be in two configurations which are shown in FIG. 3 and FIG. 4.

FIG. 3 shows a configuration of a pattern-forming body substrate employed in FIG. 1 comprising a light-shading part 5 which is formed as a pattern on a transparent substrate 4 and covered with a characteristic-changeable layer 6.

On the other hand, FIG. 4 shows a configuration in which a characteristic-changeable layer 6 is formed on one side of a transparent substrate 4 and the light-shading part is formed as a pattern on the other side.

The configuration shown in FIG. 3 indicates that a light-shading part is formed on the surface of a characteristic-changeable layer, i.e. in the position closest to the part of the contact with a photocatalyst-containing layer in a method for producing a pattern-forming body of the present invention. Accordingly, when the exposure is effected on the side of the transparent substrate for producing a pattern-forming body, the irradiated energy is not scattered and arrives at the surface of characteristic-changeable layer while reflecting the pattern formed by the light-shading part correctly. Accordingly, this configuration is advantageous greatly for the purpose of forming the characteristic-changeable pattern at a high accuracy.

On the other hand, the configuration shown in FIG. 4 indicates that a characteristic-changeable layer and a light-shading layer are formed on the different sides of a transparent substrate. This configuration is employed preferably when the light-shading part is desired to be removed after exposure to form a pattern-forming body or when the smoothness of the surface of the characteristic-changeable layer is important.

Such a light-shading part can be formed also by forming a thin film of a metal such as chromium whose thickness is 1000 to 2000 angstrom by a sputtering method, a vacuum vapor deposition method, and the like followed by patterning this thin film. Such a patterning may be accomplished by an ordinary patterning method such as a sputtering.

The material for a light-shading part in this embodiment is not limited particularly provided that it can serve as an interceptor to the energy causing the excitation of a photocatalyst upon exposure, and may typically be a layer formed by dispersing a light-shading particle such as a carbon fine grain, metal oxide, inorganic pigment, and organic pigment in a resin binder. The resin binder employed may for example be polyimide resins, acryl resins, epoxy resins, polyacrylamides, polyvinyl alcohols, gelatins, caseins, and cellulose resins, which may be employed alone or in combination, as well as photosensitive resins, O/W emulsion resin compositions, such as emulsified reactive silicone. The thickness of the light-shading resin part is within the range from 0.5 to 10 µm. A method for patterning the light-shading resin part may be an ordinarily employed method such as photo-lithography or printing process.

(Transparent Substrate)

A transparent substrate in this embodiment is described below. In this embodiment, as shown in FIG. 3 and FIG. 4, a light-shading part 5 and a characteristic-changeable layer 6 are provided on a transparent substrate 4.

Such a transparent substrate is not limited particularly provided that it exhibits a high transmittance to an energy employed for exposure, and typically, one exhibiting a high transmittance to an energy activating titanium oxide employed preferably as a photocatalyst, such as one exhibiting a high transmittance to a UV ray is employed preferably. Such a transparent substrate may be flexible or non-flexible depending on the application of a functional element.

Preferred materials exemplified typically are non-flexible transparent rigid materials such as quartz glasses, PYREX (trade mark), synthetic quartz and the like as well as flexible transparent materials such as transparent resin films and optical resin sheets.

(2) Embodiment 2

Embodiment 2 of a pattern-forming body substrate of the present invention is described below. A pattern-forming body substrate in this embodiment has a characteristic-changeable layer having a self supporting property on which a light-shading part is formed as a pattern.

FIG. 2 shows an example of a pattern-forming body substrate employed in this embodiment, in which a light-shading part 5 is formed on either surface of a characteristic-changeable layer 6 to form a pattern-forming body substrate.

(Characteristic-changeable Layer)

First, a characteristic-changeable layer in this embodiment is discussed. A characteristic-changeable layer in this embodiment is not limited particularly provided that it is a layer whose characteristics are changed by the effect of a photocatalyst-containing layer and which has a self supporting property, and may be a layer whose color, polarity, or adhesiveness is changed by the effect of a photocatalyst similarly to Embodiment 1. In this embodiment, a commercial resin film comprising a material capable of serving as a characteristic-changeable layer can be employed to promote the cost efficiency.

In this embodiment, among the characteristic-changeable layers mentioned above, a wettability-changeable layer whose wettability is changed by the effect of a photocatalyst is preferred. Such a wettability-changeable layer may typically be made from a material which is changed in such a manner that when it is brought into contact with the photocatalyst-containing layer upon exposure the contact angle with a liquid whose surface tension is equivalent to the surface tension of a composition for the functional part to be applied subsequently is changed at least by 1° or more, preferably 5° or more, especially 10° or more.

A self supporting material serving as a wettability-changeable layer in this embodiment may be one formed as a film from a material described above provided that such a film has a self supportive ability, and those which may be exemplified are polyethylenes, polycarbonates, polypropylenes, polystyrenes, polyesters, polyvinyl fluorides, acetal resins, nylon, ABS, PTFE, methacrylic resins, phenol resins, polyvinylidene fluorides, polyoxymethylenes, polyvinyl alcohols, polyvinyl chlorides, polyethylene terephthalates, silicones and the like.

While a characteristic-changeable layer in this embodiment is not limited particularly provided that it is a layer whose characteristics are changed by the effect of a photocatalyst as described above, it is preferably a layer containing no photocatalyst. The absence of any photocatalyst in the characteristic-changeable layer eliminates a sustained adverse effect on a functional element produced subsequently, enabling a prolonged satisfactory use.

(Light-shading Part)

A light-shading part employed in this embodiment is similar to that employed in Embodiment 1 described above, and is not discussed here again.

3. Arrangement of Characteristic-changeable Layer and Photocatalyst-containing Layer The arrangement of a characteristic-changeable layer and a photocatalyst-containing layer is described below. In this embodiment, a photocatalyst-containing layer should be arranged in contact with a characteristic-changeable layer upon exposure.

Figure 5:
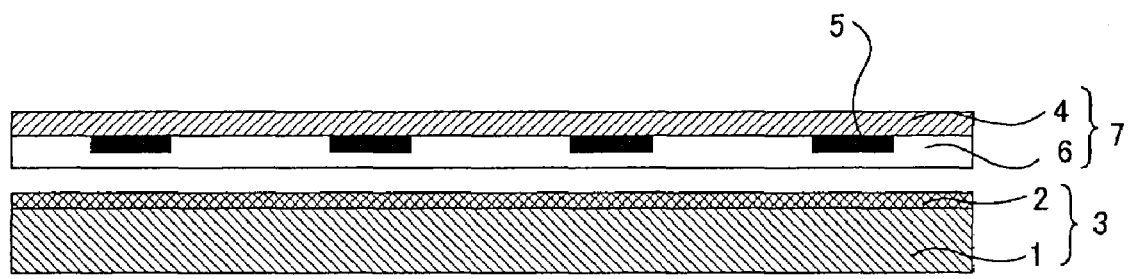
FIG. 5 is an outlined sectional view indicating an example of the condition of the contact in the method for producing a pattern-forming body of the present invention.

The contact mentioned in this embodiment means a condition under which the effect of a photocatalyst can substantially be exerted on the surface of a characteristic-changeable layer, including a condition of an actual physical contact as well as a condition shown in FIG. 5 where a photocatalyst-containing layer 2 is arranged at a certain distance from a characteristic-changeable layer 6. The distance is preferably 200 µm or less.

The distance in this embodiment is within the range of 0.2 µm to 10 µm, preferably 1 µm to 5 µm, for the purpose of an extremely satisfactory pattern accuracy and a high sensitivity of a photocatalyst which gives a satisfactory denaturalizing efficiency of a characteristic-changeable layer. The distance within the range specified above is effective especially in producing a pattern-forming body having a small surface area whose distance can be controlled at a high accuracy.

On the other hand, an employed pattern-forming body whose size is as large as 300 mm×300 mm poses a difficulty in allowing a distance as short as that described above to be provided between a photocatalyst-containing layer-sided substrate and a pattern-forming body with avoiding any contact. Accordingly, a pattern-forming body having a relatively large surface area employs a distance within the range from 10 to 100 µm, preferably 50 to 75 µm. The distance within the range specified above serves to prevent a problematic reduction in the pattern accuracy such as an obscure pattern, a problematic deterioration of the photocatalyst sensitivity which leads to a reduced denaturalizing efficiency, and a problematically uneven denaturalization of the characteristic-changeable layer.

When exposing such a relatively large pattern-forming body, the distance to be adjusted by an espousing device for positioning a photocatalyst-containing layer-sided substrate and a pattern-forming body is set to be within the range from 100 µm to 200 µm, preferably 25 µm to 75 µm. The setting of the distance within this range avoids the substantial reduction in the pattern accuracy or the deterioration in the photocatalyst sensitivity, and enables the arrangement of the photocatalyst-containing layer-sided substrate and the pattern-forming body without undergoing any contact.

By arranging a photocatalyst-containing layer and a characteristic-changeable layer at a certain distance described above, oxygen, water, and active oxygen species generated by the photocatalyst effect can readily be desorbed. Thus, a distance between a photocatalyst-containing layer and a characteristic-changeable layer shorter than that specified above makes the desorption of the active oxygen species difficult, resulting in a reduced denaturalizing rate. A distance larger than that specified above poses difficulty in allowing the generated active oxygen species to arrive at the characteristic-changeable layer, also resulting in a reduced denaturalizing rate.

In this embodiment, the contact in the manner described above may be maintained at least for the period of the exposure.

4. Exposure of Contact Part

In the present invention, the contact part is exposed while maintaining the condition of the contact as described above. The exposure mentioned here means a concept including any energy irradiation capable of allowing a photocatalyst-containing layer to change the characteristics of a surface of a characteristic-changeable layer, and is not limited to the irradiation of a visual light.

The wavelength of a light employed usually in such an exposure is 400 nm or less, preferably 380 nm or less. Such a wavelength is preferable as energy to activate the photocatalytic effect of titanium oxide which is contained as a photocatalyst preferably in a photocatalyst-containing layer.

A light source employed in the exposure may for example be a mercury lamp, metal halide lamp, xenon lamp, excimer lamp, and the like.

The energy irradiation level for the exposure should be sufficient to accomplish the change in the characteristics of the surface of a characteristic-changeable layer as a result of the effect of a photocatalyst contained in a photocatalyst-containing layer.

In this process, the sensitivity can be increased by conducting the exposure with heating the photocatalyst-containing layer, allowing the change in the characteristics to occur efficiently. Typically, the heating is accomplished at a temperature within the range from 30° C. to 80° C.

The exposure in the present invention is directed from the side of the pattern-forming body substrate over the entire surface of the pattern-forming body substrate on the side where no characteristic-changeable layer is formed, unless any particular requirement is specified.

5. Removal of Photocatalyst-containing Layer-sided Substrate

Figure 1D:
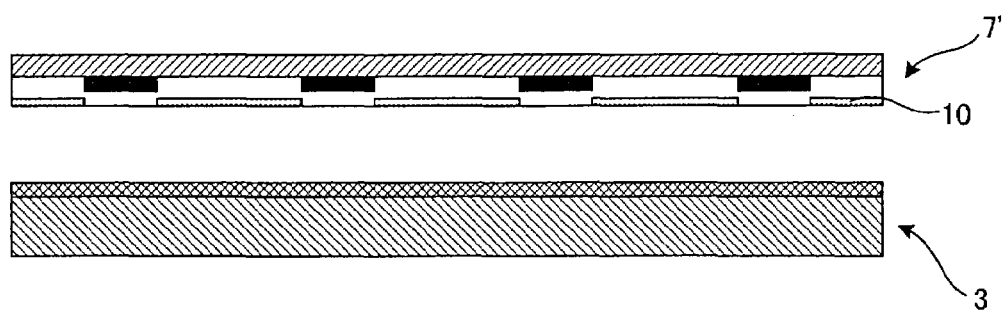

After completing the exposure as described above, a photocatalyst-containing layer-sided substrate is removed from the position where it is in contact with a characteristic-changeable layer, whereby obtaining a pattern-forming body 7' as shown in FIG. 1D.

A pattern-forming body thus obtained has on its surface a pattern in which the characteristics of a characteristic-changeable layer have been changed, and by placing in this denaturalized region a composition for the functional part, the functional part can be formed as a pattern, whereby enabling the production of various functional elements.

B. Pattern-forming Bodies

A pattern-forming body of the present invention is described below. A pattern-forming body of the invention is an article having a pattern where the characteristics of a characteristic-changeable layer have been changed on a pattern-forming body substrate described in the sections of "2. Pattern-forming body substrate" in "A. Methods for producing pattern-forming bodies" described above.

A characteristic-changeable layer in the present invention is not limited particularly, and may for example be a layer which is colored or whose adhesiveness is changed by the effect of a photocatalyst, and in the invention it is preferable that the characteristic-changeable layer is a wettability-changeable layer or a decomposition-removable layer.

When the characteristic-changeable layer is a wettability-changeable layer, a material for a wettability-changeable layer described above in the section of the pattern-forming body substrate can be employed, and a pattern formed typically is a pattern comprising a lyophilic region and a lyophobic region having such characteristics that the contact angle with a liquid whose surface tension is equivalent to the surface tension of a composition for the functional part to be applied subsequently is different from each other at least by 1° or more, preferably 5° or more, especially 10° or more.

A lyophobic region in a pattern-forming body in this embodiment is characterized by a contact angle with a liquid whose surface tension is 40 mN/m of 10° or more, preferably a contact angle with a liquid whose surface tension is 30 mN/m of 10° or more, particularly a contact angle with a liquid whose surface tension is 20 mN/m of 10° or more.

A lyophilic region in a pattern-forming body in this embodiment is characterized by a contact angle with a liquid whose surface tension is 40 mN/m of 9° or less, preferably a contact angle with a liquid whose surface tension is 50 mN/m of 10° or less, particularly a contact angle with a liquid whose surface tension is 60 mN/m of 10° or less.

When the characteristic-changeable layer is a decomposition-removable layer, a material for a decomposition-removable layer described above in the section of the pattern-forming body substrate can be employed, and a pattern formed in the pattern-forming body typically comprising the region of the decomposition-removable layer and the region where the decomposition-removable layer has been removed to allow a transparent substrate to come out. In the pattern-forming body whose decomposition-removable layer has been decomposed and removed, it is preferable that the region comprising the decomposition-removable layer and the region comprising the transparent substrate layer are different from each other in the wettability, and more preferable that the region comprising the decomposition-removable layer is a lyophobic region and the region comprising the transparent substrate layer is the lyophilic region.

A lyophobic region comprising a decomposition-removable layer in this embodiment is characterized preferably by a contact angle with a liquid whose surface tension is 40 mN/m of 10° or more, preferably a contact angle with a liquid whose surface tension is 30 mN/m of 10° or more, particularly a contact angle with a liquid whose surface tension is 20 mN/m of 10° or more.

A lyophilic region comprising a transparent substrate in this embodiment is characterized preferably by a contact angle with a contact angle with a liquid whose surface tension is 40 mN/m of 9° or less, preferably a contact angle with a liquid whose surface tension is 40 mN/m of 5° or less, particularly 1° or less.

A pattern-forming body of the present invention enables the production of various functional elements by depositing a composition for the functional part along the pattern formed as a result of the change in the characteristics of its characteristic-changeable layer. A pattern-forming body in the present invention may itself be a functional element having a function.

A pattern-forming body of the present invention is formed preferably from a material having no photocatalyst. When a pattern-forming body is formed from a material containing a photocatalyst, it is subjected to an unwanted sustained effect depending on the condition of the use.

Other aspects of a pattern-forming body of the present invention are similar to those described above in the section of "2. Pattern-forming body substrate" and are not discussed here again.

C. Functional Elements

A functional element of the present invention is characterized by a functional part formed as a pattern where the characteristics of a pattern-forming body described above have been changed.

The term "functional" mentioned here means various functions such as optical functions (selective light absorption, reflection, polarization, selective light transmission, non-linear optical property, luminescence such as fluorescence and phosphorescence, photochromic property and the like), magnetic functions (ferromagnetic property, electrochemical property, soft magnetic property, non-magnetic property, magnetism-transmitting property), electric and electronic functions (conductivity, insulating property, piezoelectric property, pyroelectric property, dielectric property), chemical functions (adsorption, desorption, catalytic property, hygroscopicity, ion transmitting property, redox property, electrochromic property and the like), mechanical functions (wearing resistance and the like), thermal functions (thermal transmission, thermal insulation, infrared irradiation and the like), biological functions (biocompatibility, thrombolytic property and the like).

The placement of such a functional part to the position corresponding to the pattern on a pattern-forming body is conducted on the basis of the difference in the wettability between a lyophilic region and a lyophobic region, or on the basis of the difference in the adhesiveness.

For example when utilizing the difference in the adhesiveness of the characterized pattern on a characteristic-changeable layer, a metal as a composition for the functional part is vapor-deposited all over the characteristic-changeable layer and subsequently peeled off using an adhesive tape and the like, whereby forming a metal pattern as a functional part exclusively in the region where the adhesiveness is satisfactory. This enables an easy formation of a print circuit board and the like.

For example when utilizing the difference in the wettability of the characterized pattern on a characteristic-changeable layer, a composition for the functional part is applied onto the pattern-forming body to allow it to deposit exclusively onto the satisfactorily wettable lyophilic region, whereby allowing the functional part to be placed readily and exclusively on the pattern in the lyophilic region of the pattern-forming body.

A composition for the functional part employed in the present invention may vary greatly depending on the functions of the functional element and the method for producing the functional element as described above, and for example when forming a metal pattern on the basis of the difference in the adhesiveness as described above then this composition for the functional part is present as a metal, and when forming a metal pattern on the basis of the difference in the wettability then a composition which has not been diluted with a solvent such as a UV setting monomer or a composition in the form of a liquid which has been diluted with a solvent can be employed.

When using a liquid composition which has been diluted with a solvent, the solvent is preferably one exhibiting a high surface tension such as water and ethylene glycol. As a composition for the functional part, one having a lower viscosity is more preferred since a pattern can be formed within a shorter period. Nevertheless, when using a liquid composition which has been diluted with a solvent, the solvent is preferably less volatile since the volatilization of the solvent upon forming a pattern results in an increase in the viscosity and the change in the surface tension.

A composition for the functional part employed in the present invention may be one becoming a functional part by being placed on a pattern-forming body for example by means of adhesion, or one becoming a functional part by being placed on a pattern-forming body and then treated for example with a reagent, UV ray, or heat. In such a case, a component which is hardened by a UV ray, heat, or electron beam is contained preferably as a binder for the composition for the functional part since it allows the functional part to be formed rapidly by a hardening process.

Typically, such a functional element can be formed by applying a composition for the functional part by means of a coating process such as dip coating, roll coating, blade coating, and spin coating, or by means of a nozzle injection such as an ink jet process, whereby forming a functional part on the lyophilic pattern on the surface of a pattern-forming body.

Also by applying a pattern-forming body of the present invention to a metal film-forming method by an electroless plating, a functional element having a pattern of a metal film as a functional part can be obtained. Typically, by utilizing the difference in the wettability, only the lyophilic region on the surface of a characteristic-changeable layer of a pattern-forming body is treated with a pretreatment solution of the chemical plating and then the treated pattern-forming body is immersed in the chemical plating regent, whereby obtaining a functional element having a desired metal pattern on the characteristic-changeable layer. Since a metal pattern can be formed without forming a resist pattern in this method, a print board and electronic circuit element can be produced as a functional element.

It is also possible that after overlaying the composition for the functional part entirely as described above an unwanted region is removed utilizing the difference in the wettability between the lyophobic region and the lyophilic region to form a functional part along the pattern. Thus, by utilizing the difference in the adhesiveness between the lyophobic region and the lyophilic region, an unwanted region is removed in a post-treatment process for example by sticking an adhesive tape followed by peeling off, by air-blowing, or by treating with a solvent, whereby yielding a pattern of the functional part.

In this case, it is required to place the composition for the functional part all over the surface of the characteristic-changeable layer of the pattern-forming body of the present invention, for example by a vacuum film-forming device such as PVD and CVD.

Figure 6A:
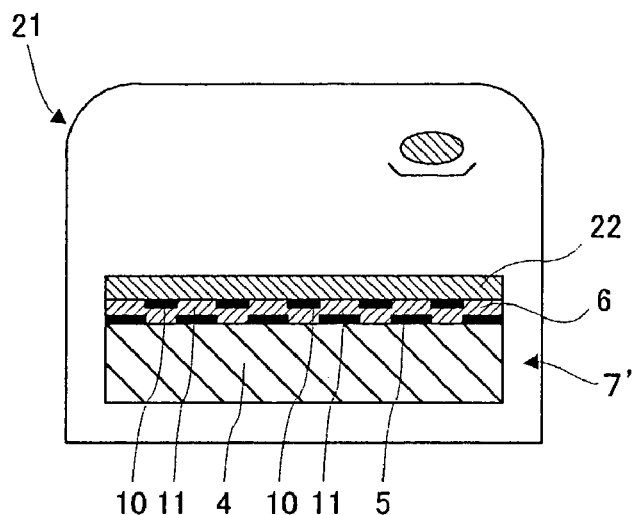
FIGS. 6A to 6C are outlined sectional views illustrating a functional element of the present invention.

An example of the method for producing such a functional element is described with referring to the figures. In the following example, a wettability-changeable layer is employed as a characteristic-changeable layer. First, by employing a vacuum film-forming device 21 utilizing the vacuum such as CVD as shown in FIG. 6A, a composition for the functional part 22 is formed all over a pattern-forming body 7' in which a wettability-changeable layer 8 having a pattern of a lyophilic region 10 and a lyophobic region 11 is provided on a transparent substrate 4. On the transparent substrate 4, a light-shading part 5 is formed as a pattern.

Figure 6B:
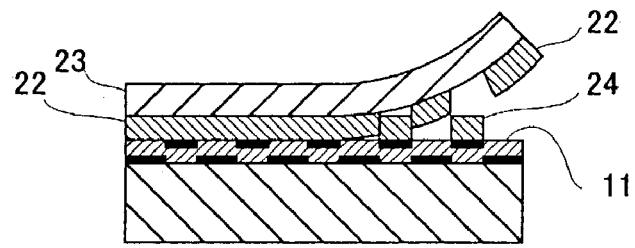
Figure 6C:
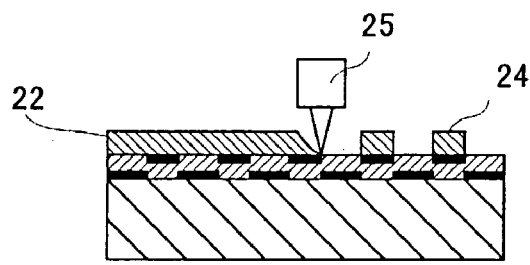

A method for removing an unwanted part of the composition for the functional part 22 thus formed entirely may be a method in which the adhesive side of an adhesive tape 23 is applied and then peeled off to remove the composition for the functional part 22 on the lyophobic region 11 to form a functional part 24 as shown in FIG. 6B or a method in which air is blown from a air blowing nozzle 25 to remove the unwanted part of the composition for the functional part 22 to form a functional part 24 as shown in FIG. 6C.

Figure 7A:
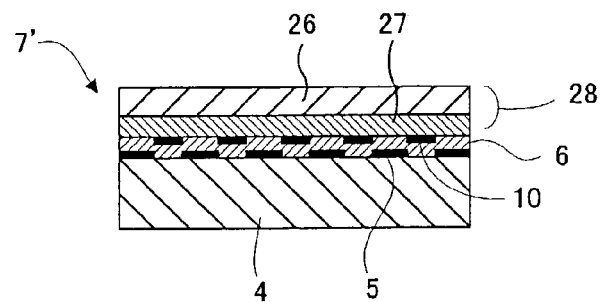
FIGS. 7A to 7D are outlined sectional views illustrating a functional element of the present invention.

In a still another example, as shown in FIG. 7A, a heat transfer article 28 formed by laminating a heat-fusable composition layer 27 on one side of a sheet 26 is brought into close contact with the surface of a wettability-changeable layer 8 formed on a pattern-forming body 7', i.e., on a transparent substrate 4 with bringing the heat-fusable composition layer 27 in contact with the wettability-changeable layer 8. Also in this case, a light-shading part 5 is formed as a pattern on the transparent substrate 4.

Figure 7B:
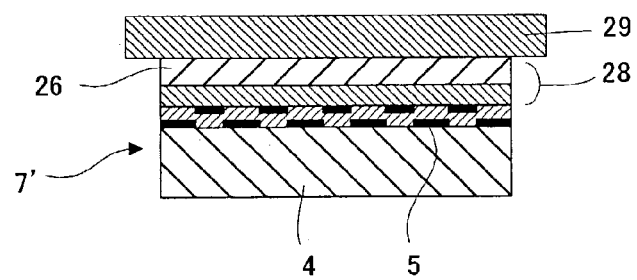
Figure 7C:
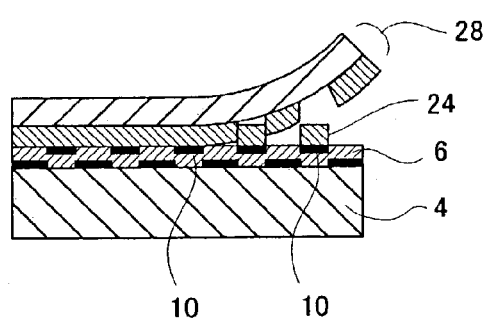
Figure 7D:
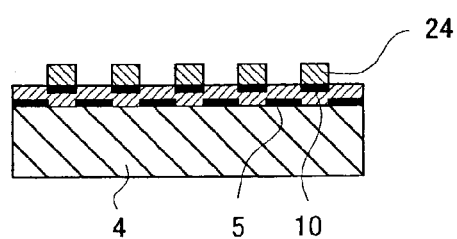

Subsequently, as shown in FIG. 7(B), a heating plate 29 is pressed on the side of a sheet 26 of the heat transfer article 28. Then as shown in FIG. 7(C), after cooling the heat transfer article 28 is pulled off to obtain a functional element in which a functional part 24 is formed along the pattern in a lyophilic region 10 formed on the wettability-changeable layer 8 (FIG. 7(D)).

A functional element thus obtained may typically be a color filter, microlens, print board, electric circuit element and the like.

A pattern-forming body employed in the description of a functional element described above is similar to that described above, and not discussed here again.

D. Color Filters

A color filter mentioned above is employed for example in a liquid crystal display, in which a plural of pixel parts such as red, green, and blue are formed as a highly minute pattern for example of a glass substrate. By applying a pattern-forming body of the present invention to the production of this color filter, a highly minute color filter can be obtained at a low cost.

Thus, an ink (composition for the functional part) is deposited for example by an ink jet device onto a lyophilic region of a pattern-forming body and then hardened to form a pixel part (functional part) easily, whereby allowing a highly minute color filter to be obtained by a smaller number of process.

Also in the present invention, a light-shading part of a pattern-forming body described above can itself be used as a black matrix in a color filter. Accordingly, by forming a pixel part (colored layer) as a functional part on a pattern-forming body of the invention described above, a color filter can be obtained without forming a black matrix separately.

E. Microlenses

When a functional element is a microlens, a pattern-forming body having a round pattern whose wettability has been changed may for example be formed on a wettability-changeable layer. Subsequently, a lens-forming composition (composition for the functional part) is added dropwise onto the site where the wettability has been changed to allow the composition to spread exclusively on the lyophilic region where the wettability has been changed, and a further dropwise addition enables the change in the contact angle of the liquid drop. By hardening this lens-forming composition, a lens having varying shape and focal distance can be obtained, whereby yielding a highly minute microlens.

Figure 8A:
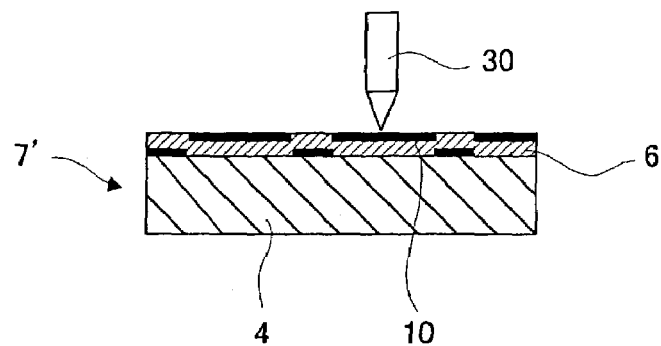
FIGS. 8A to 8C are outlined sectional views illustrating an example of the method for producing a microlens according to the present invention.
Figure 8B:
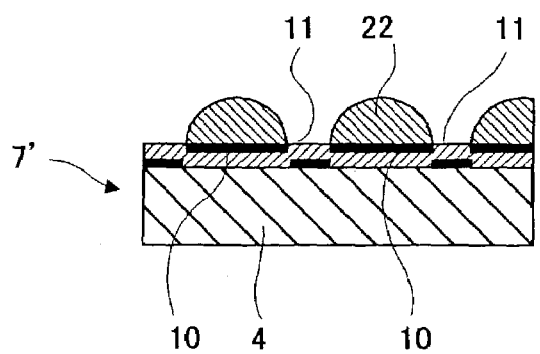
Figure 8C:
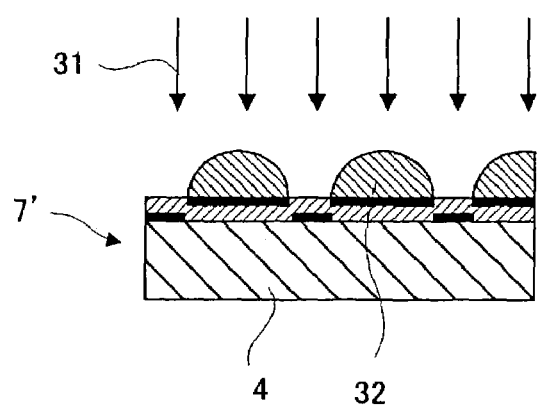

In a method for producing such a microlens when described with referring to FIG. 8, a pattern-forming body 7' having a round pattern of a lyophilic region 10 formed on a wettability-changeable layer 8 is prepared, and then toward the pattern of this round lyophilic region 10 a UV setting resin composition as a composition for the functional part is ejected via an ejecting device 30 (FIG. 8A). This composition for the functional part (UV setting resin composition) 22 is swollen as a result of the difference in the wettability between the lyophilic region 10 and the lyophobic region 11 (FIG. 8B). This is then hardened by a resin setting UV ray 31 to form a microlens 32 (FIG. 8C).

The present invention is not restricted to the embodiments described above. The embodiments described above are only illustrative, and those having the aspects substantially similar to the technical spirits described in the aspects and exhibiting similar effects are encompassed in the present invention.

For example, while a light-shading part in the pattern-forming body substrate is discussed in a method for producing a pattern-forming body described above only as being formed on a transparent substrate, it can be formed also on a characteristic-changeable layer. In such a case, the light-shading part serves as a spacer when the exposure is performed with bringing the characteristic-changeable layer into contact with a photocatalyst-containing layer.

Figure 9A:
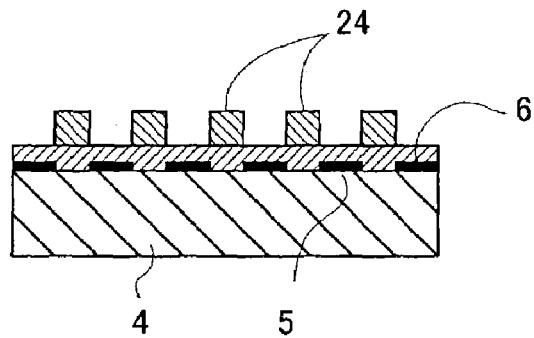
FIGS. 9A to 9C are outlined sectional views illustrating a functional element of the present invention.
Figure 9B:
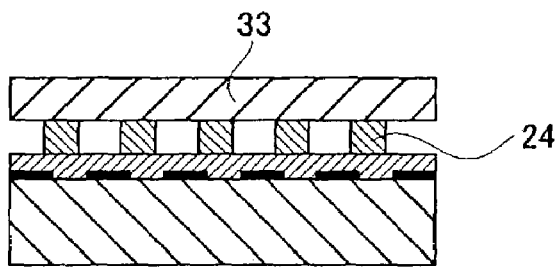
Figure 9C:
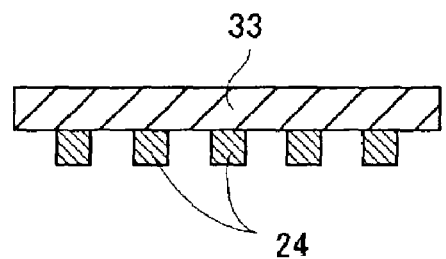

Also while in the above description a functional element is discussed all as being formed on a pattern-forming body, the present invention is not limited to such an aspect. Thus, for example as shown in FIG. 9, a wettability-changeable layer 8 is formed first on a transparent substrate 4 by a method similar to that described above and then a functional part 24 is formed along the pattern of the hydrophilic region of this wettability-changeable layer 8 (FIG. 9A). Then an element-forming substrate 33 is brought into close contact with this functional part 24 (FIG. 9B). Then the functional part 24 is transferred onto the element-forming substrate 33, whereby obtaining a functional element. Thus, the functional element is not limited to be formed on a pattern-forming body.

EXAMPLES

The present invention is further described in the following examples.

Example 1

A fluorine-based silicone was formed as a film whose thickness is 0.1 μm on a quartz glass substrate having a pattern of a 0.2 μm-thick and 20 μm-wide chromium line formed an interval of 100 μm to form a wettability-changeable layer to provide a pattern-forming body substrate.

The fluorine-based silicone employed here was prepared by admixing 5 g of a fluoroalkylsilane (GE Toshiba Silicones, TSL8233) with 3 g of 1N hydrochloric acid, stirring for 24 hours, subjected to 10-fold dilution with isopropyl alcohol to obtain a coating solution, which was then applied by a spin coating method and dried to form a film.

On a soda lime glass substrate, ST-K01 (Ishihara Sangyo Kaisha, Ltd.) was applied to provide a photocatalyst-containing layer-sided substrate having a photocatalyst-containing layer whose thickness was 0.2 μm. The substrate was arranged in such a manner that the wettabilty change layer was facing the photocatalyst-containing layer at the distance of 5 μm, and irradiated from the side of the pattern-forming body substrate with a mercury lamp (254 nm, 40 mW/cm$^2$) for 120 seconds. The wettability of the surface of the wettability-changeable layer in the exposed part was 20° as a contact angle with water, while that of a non-exposed part was 110°.

Then the paints for a color filter (red, blue, green) were ejected sequentially by an ink jet method onto the part where the wettability had been changed on the pattern-forming body to obtain a color filter.

Example 2

1. Formation of Photocatalyst-containing Layer-sided Substrate 5 g of trimethoxymethylsilane (GE Toshiba Silicones, TSL8113) was mixed with 2.5 g of 0.5 N hydrochloric acid, and stirred for 8 hours. The mixture was subjected to 10-fold dilution with isopropyl alcohol to obtain a primer layer-forming composition.

The primer layer-forming composition thus obtained was applied onto a quartz glass substrate using a spin coater and dried at 150° C. for 10 minutes to form a transparent primer layer (thickness: 0.2 μm).

30 g of isopropyl alcohol, 3 g of trimethoxymethylsilane (GE Toshiba Silicones, TSL8113), and 20 g of inorganic coating for photocatalyst ST-K03 (Ishihara Sangyo Kaisha, Ltd.) were mixed, and stirred at 100° C. for 20 minutes. The mixture was subjected to 3-fold dilution with isopropyl alcohol to obtain a photocatalyst-containing layer-forming composition.

The photocatalyst-containing layer-forming composition thus obtained was applied using a spin coater onto a quartz glass substrate on which a primer layer had been formed, and dried at 150° C. for 10 minutes to obtain a transparent photocatalyst-containing layer (thickness: 0.15 μm)

2. Patterning of Self Supporting Characteristic-changeable Layer by Exposure

The photocatalyst-containing layer-sided substrate and a polycarbonate substrate on the surface of which a light-shading layer had been formed were aligned to face each other at a distance of 100 μm, and exposed from the side of the polycarbonate substrate with a very high pressure mercury lamp (wavelength: 365 nm) at 40 mW/cm$^2$ for 1200 seconds to form a pattern whose characteristics had been changed.

In this procedure, the contact angles of the non-exposed part and the exposed part with the wettability index standard solution whose surface tension was 40 mN/m (JUNSEI CHEMICAL CO., LTD.) were measured using a contact angle meter (Kyowa Interface Science Co., LTD., Model CA-Z) (30 seconds after dropwise addition from a microsyringe), and the results indicated that the contact angles were 49° and 20°, respectively.

Example 3

1. Formation of Photocatalyst-containing Layer-sided Substrate 5 g of trimethoxymethylsilane (GE Toshiba Silicones, TSL8113) was mixed with 2.5 g of 0.5 N hydrochloric acid, and stirred for 8 hours. The mixture was subjected to 10-fold dilution with isopropyl alcohol to obtain a primer layer-forming composition.

The primer layer-forming composition thus obtained was applied onto a quartz glass substrate using a spin coater and dried at 150° C. for 10 minutes to form a transparent primer layer (thickness: 0.2 μm).

30 g of isopropyl alcohol, 3 g of trimethoxymethylsilane (GE Toshiba Silicones, TSL8113), and 20 g of inorganic coating for photocatalyst ST-K03 (Ishihara Sangyo Kaisha, Ltd.) were mixed, and stirred at 100° C. for 20 minutes. The mixture was subjected to 3-fold dilution with isopropyl alcohol to obtain a photocatalyst-containing layer-forming composition.

The photocatalyst-containing layer-forming composition thus obtained was applied using a spin coater onto a quartz glass substrate on which a primer layer had been formed, and dried at 150° C. for 10 minutes to obtain a transparent photocatalyst-containing layer (thickness: 0.15 μm).

2. Formation of Decomposition-removable Layer

A cationic polymer polydiallyldimethylammonium chloride (PDDA, mean molecular weight: 100,000 to 200,000, Aldrich) and an anionic polymer polystyrene sodium sulfonate salt (PSS, mean molecular weight: 70,000, Aldrich) were subjected to a layer-by-layer self-assembling on a glass substrate on which a light-shading layer had been formed to obtain a thickness of about 2 nm.

3. Decomposition and Removal by Exposure

The photocatalyst-containing layer-sided substrate and a decomposition-removable layer were aligned to face each other at a distance of 50 μm, and exposed from the side of the decomposition-removable layer with a very high pressure mercury lamp (wavelength: 365 nm) at 40 mW/cm$^2$ for 130 seconds to decompose and remove the decomposition-removable layer whereby forming a pixel-forming part comprising the glass substrate which had come out.

In this procedure, the contact angles of the non-exposed part and the pixel-forming part with the wettability index standard solution whose surface tension was 40 mN/m (JUNSEI CHEMICAL CO., LTD.) were measured using a contact angle meter (Kyowa Interface Science Co., LTD., Model CA-Z) (30 seconds after dropwise addition from a microsyringe), and the results indicated that the contact angles were 30° and 6°, respectively.

What is claimed is:

1. A method for producing a pattern-forming body comprising:
   using a photocatalyst-containing layer-sided substrate having a substrate and a photocatalyst-containing layer containing a photocatalyst and a pattern-forming body substrate having a characteristic-changeable layer, whose characteristics are changed by the effect of the photocatalyst in the photocatalyst-containing layer and a light-shading part formed as a pattern;
   placing the photocatalyst-containing layer-sided substrate and the pattern-forming body substrate in such a manner that the photocatalyst-containing layer and the characteristic-changeable layer are brought into contact with each other;
   changing the characteristics of the characteristic-changeable layer of the exposed part by exposing from the side of the pattern-forming body substrate; and
   removing the photocatalyst-containing layer-sided substrate whereby obtaining a pattern-forming body having a pattern whose characteristics have been changed on the characteristic-changeable layer.

2. A method for producing a pattern-forming body comprising:
   using a photocatalyst-containing layer-sided substrate having a substrate and a photocatalyst-containing layer containing a photocatalyst and a pattern-forming body substrate having a characteristic-changeable layer, whose characteristics are changed by the effect of the photocatalyst in the photocatalyst-containing layer, and a light-shading part formed as a pattern;
   placing the photocatalyst-containing layer-sided substrate and the pattern-forming body substrate in such a manner that the distance between the photocatalyst-containing layer and the characteristic-changeable layer is 200 μm or less;
   changing the characteristics of the characteristic-changeable layer of the exposed part by exposing from the side of the pattern-forming body substrate; and
   removing the photocatalyst-containing layer-sided substrate whereby obtaining a pattern-forming body having a pattern whose characteristics have been changed on the characteristic-changeable layer.

3. A method for producing a pattern-forming body according to claim 2, wherein the pattern-forming body substrate comprises a transparent substrate, a characteristic-changeable layer formed on the transparent substrate and a light-shading part formed as a pattern.

4. A method for producing a pattern-forming body according to claim 3, wherein the light-shading part has been formed as a pattern on the transparent substrate, and is covered with the characteristic-changeable layer formed thereon.

5. A method for producing a pattern-forming body according to claim 2, wherein the photocatalyst-containing layer is a layer consisting of a photocatalyst.

6. A method for producing a pattern-forming body according to claim 5, wherein the photocatalyst-containing layer is a layer obtained by forming a film of a photocatelyst on a substrate by means of a vacuum film-forming method.

7. A method for producing a pattern-forming body according to claim 2, wherein, the photocatalyst-containing layer is a layer having a photocatalyst and a binder.

8. A method for producing a pattern-forming body according to claim 2, wherein, the photocatalyst is one or more substances selected from the group comprising titanium oxide ($TiO_2$), zincoxide (ZnO), tinoxide ($SnO_2$), strontium titanate ($SrTiO_3$), tungsten oxide ($WO_3$), bismuth oxide ($Bl_2O_3$), and iron oxide ($Fe_2O_3$).

9. A method for producing a pattern-forming body according to claim 8, where in the photocatalyst is titanium oxide ($TiO_2$).

10. A method for producing a pattern-forming body according to claim 2, wherein the exposure is effected with heating the photocatalyst-containing layer.

11. A method for producing a pattern-forming body according to claim 2., wherein the distance between the photocatalyst-containing layer and the characteristic-changeable layer is within the range from 0.2 μm to 10 μm when the surface of the characteristic-changeable layer is faced to the photocatalyst-containing layer to effect the exposure.

12. A method for producing a pattern-forming body according to claim 2, wherein the characteristic-changeable layer is a layer containing no photocatalyst.

13. A method for producing a pattern-forming body according to claim 2, wherein the characteristic-changeable layer is a wettability-changeable layer whose wettability is changed in such a manner that the contact angle with a liquid upon exposure is reduced by the effect of the photocatalyst contained in the photocatalyst- containing layer.

14. A method for producing a pattern-forming body according to claim 13, wherein the contact angle with a liquid whose surface tension is 40 mN/m on the wettability-changeable layer is 10° or more in a non-exposed part and 9° or less in an exposed part.

15. A method for producing a pattern-forming body according to claim 13, wherein the wettability-changeable layer is a layer containing an organopolysiloxane.

16. A method for producing a pattern-forming body according to claim 15, Wherein the organopolysiloxane is a polysiloxane containing a fluoroalkyl group.

17. A method for producing a pattern-forming body according to claim 15, wherein the organopolysiloxane is an organopolysiloxane which is a hydrolytic condensate or a hydrolytic co-condensate of one or more silicon compounds represented by Formula: $Y_nSiZ_{(4-n)}$, wherein Y denotes an alkyl group fluoroalkyl group, vinyl group, amino group, phenyl group, or epoxy group, X denotes an alkoxyl group or halogen, and n denotes an integer of 0 to 3.

18. A method for producing a pattern-forming body according to claim 13, wherein the pattern-forming body substrate has a self supporting wettability-changeable layer on whose surface a light-shading part formed as a pattern is provided.

19. A method for producing a pattern-forming body according to claim 2, wherein the characteristic-changeable layer is a decomposition-removable layer which is decomposed and removed upon exposure by the effect of the photocatalyst in the photocatalyst-containing layer.

20. A method for producing a pattern-forming body according to claim 19, wherein the contact angle of a liquid with the decomposition-removable layer is different from the contact angle of a liquid with the transparent substrate which comes out when the decomposition-removable layer is decomposed and removed.

21. A method for producing a pattern-forming body according to claim 19, wherein the decomposition-removable layer is either one of a self-assembled monolayer, Langmuir-Blodgett film or layer-by-layer self-assembled film.

22. A method for producing a pattern-forming body according to claim 19, wherein the wettability on the transparent substrate is 9° or less as a contact angle with a liquid whose surface tension being 40 mN/m and that on the decomposition-removable layer being 10° or more.

23. A pattern-forming body comprising:
a transparent substrate;
a characteristic-changeable layer formed on the transparent substrate, whose characteristics are changed by the effect of a photocatalyst, and the characteristics thereof have been changed as a pattern; and
a light-shading part formed as a pattern on the transparent substrate, wherein the light-shading part is covered with the characteristic-changeable layer formed thereon.

24. A pattern-forming body according to claim 23, wherein the characteristic-changeable layer is a wettability-changeable layer whose wettability is changed by the effect of the photocatalyst.

25. A pattern-forming body according to claim 24, wherein the contact angle with a liquid whose surface tension is 40 mN/m on the wettability-changeable layer is 10° or more in a non-exposed part and 9° or less in an exposed part.

26. A pattern-forming body according to claim 24, wherein the wettability-changeable layer is a layer containing an organopolysiloxane.

27. A pattern-forming body according to claim 26, wherein the organopolysiloxane is a polysiloxane containing a fluoroalkyl group.

28. A pattern-forming body according to claim 26, wherein the organopolysiloxane is an organopolysiloxane which is a hydrolytic condensate or a hydrolytic co-condensate of one or more silicon compounds represented by Formula: $Y_nSiZ_{(4-n)}$, wherein Y denotes an alkyl group, fluoroalkyl group, vinyl group, amino group, phenyl group, or epoxy group, X denotes an alkoxyl group or halogen, and n denotes an integer of 0 to 3.

29. A pattern-forming body according to claim 24, wherein the wettability-changeable layer is a layer containing no photocatalyst.

30. A pattern-forming body according to claim 23, wherein the characteristic-changeable layer is a decomposition-removable layer which is decomposed and removed by the effect of the photocatalyst.

31. A pattern-forming body according to claim 30, wherein the light-shading part has been formed as a pattern on the transparent substrate, and is covered with the decomposition-removable layer.

32. A pattern-forming body according to claim 30, wherein the contact angle of a liquid with the decomposition-removable layer is different from the contact angle of a liquid with the transparent substrate which comes out when the decomposition-removable layer is decomposed and removed.

33. A pattern-forming body according to claim 30, wherein the decomposition-removable layer is either one of a self-assembled monolayer, Langmuir-Blodgett film, or layer-by-layer self-assembled film.

34. A pattern-forming body according to claim 30, wherein the wettability on the transparent substrate is 9° or less as a contact angle with a liquid whose surface tension is 40 mN/m and the wettability on the decomposition-removable layer is 10° or more.

35. A functional element comprising, a functional part positioned along the pattern formed by the change in the characteristics in a characteristic-changeable layer on a transparent substrate according to claim 23.

36. A functional element according to claim 35, wherein the functional part is a metal.

37. A color filter comprising, a pixel part as a functional part of a functional element according to claim 35.

38. A microlens comprising, a lens part as a functional part of a functional element according to claim 35.

39. A pattern-forming body comprising, a self supporting wettability-changeable layer and a light-shading part formed as a pattern on one side of the wettability-changeable layer and also comprising, a pattern comprising a lyophilic region and a lyophobic region on the other side of the wettability-changeable layer.

* * * * *